(12) United States Patent
Kozuma

(10) Patent No.: US 9,590,594 B2
(45) Date of Patent: Mar. 7, 2017

(54) LEVEL SHIFTER CIRCUIT

(71) Applicant: Semiconductor Energy Laboratory Co., Ltd., Kanagawa-ken (JP)

(72) Inventor: Munehiro Kozuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 44 days.

(21) Appl. No.: 14/638,331

(22) Filed: Mar. 4, 2015

(65) Prior Publication Data

US 2015/0256157 A1  Sep. 10, 2015

(30) Foreign Application Priority Data

Mar. 5, 2014 (JP) ................. 2014-042758
Mar. 12, 2014 (JP) ................. 2014-048642

(51) Int. Cl.
| | |
|---|---|
| *H03L 5/00* | (2006.01) |
| *H03K 3/012* | (2006.01) |
| *H03K 3/356* | (2006.01) |

(52) U.S. Cl.
CPC ....... *H03K 3/012* (2013.01); *H03K 3/356017* (2013.01)

(58) Field of Classification Search
CPC ........... H03K 3/356; H03K 19/018521; H03K 19/00315; H03K 17/102; H03K 3/012
USPC ................ 327/306, 333; 326/61–62, 80–81; 325/61–62, 80–81
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 5,835,999 A * | 11/1998 | Grosspietsch ......... | G05F 3/242 327/112 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,005,909 B2 * | 2/2006 | Shin ................ | H03K 19/01714 326/63 |
| 7,049,190 B2 | 5/2006 | Takeda et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Dinh T Le
(74) *Attorney, Agent, or Firm* — Husch Blackwell LLP

(57) ABSTRACT

Leakage current in a standby mode of a level shifter capable of operating with low voltage is reduced. Provided is a level shifter circuit in which an n-channel silicon transistor and an oxide semiconductor transistor are provide in series between an output signal line and a low potential power supply line. The potential of a gate electrode of the oxide semiconductor transistor is raised to a potential higher than input signal voltage by capacitive coupling, so that on-state current of the oxide semiconductor transistor is increased.

20 Claims, 15 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,674,738 B2 | 3/2014 | Nishijima |
| 8,786,350 B1 * | 7/2014 | Pelley .................. H03K 3/021 327/108 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2012/0294096 A1 | 11/2012 | Nishijima |
| 2014/0333365 A1 | 11/2014 | Takahashi |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Meiboom.S at al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review, A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B; Mg; Mn; Fe; Ni; Cu, or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

(56) References Cited

OTHER PUBLICATIONS

Li.C. et al., "Modulated Structures of Homologous Compounds InMO3(ZnO)m (M=in,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K at al., "Thin-Film Transistor Fabricated in Single-Crystalline Transparent Oxide Semiconductor", Science, May 23, 2003, vol. 300, No. 5623, pp. 1269-1272.

Ikeda.T at al., "Full-Functional System Liquid Crystal Display Using Cg-Silicon Technology", SID Digest '04 : SID International Symposium Digest of Technical Papers, 2004, vol. 35, pp. 860-863.

Nomura.K at al., "Room-Temperature Fabrication of Transparent Flexible Thin-Film Transistors Using Amorphous Oxide Semiconductors", Nature, Nov. 25. 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H at al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H at al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T at al., "Novel Top-Gate Zinc Oxide Thin-Film Transistors (ZnO TFTS) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-IN. AMOLED Display With Driver Circuit Using Amorphous In—Ga—Zn—Oxide TDTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H at al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D at al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H at al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T at al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H at al., "21.3:4.0 IN. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Godo.H at al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T at al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H at al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size Amoled Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTlO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Ali, S. et al, "A Robust, Low Power, High Speed Voltage Level Shifter With Built-in Short Circuit Current Reduction," IEEE 2011, 20th European Conference on Circuit Theory and Design (ECCTD), Aug. 29, 2011, pp. 142-145.

* cited by examiner caused by substrate

LEVEL SHIFTER CIRCUIT

BACKGROUND OF THE INVENTION

1. Field of the Invention

The present invention relates to an object, a method, or a manufacturing method. In addition, the present invention relates to a process, a machine, manufacture, or a composition of matter. One embodiment of the present invention relates to, for example, a semiconductor device, a display device, a light-emitting device, a power storage device, a driving method thereof, or a manufacturing method thereof. In particular, one embodiment of the present invention relates to, for example, a semiconductor device, a display device, or a light-emitting device each including an oxide semiconductor.

2. Description of the Related Art

Power consumption of an FPGA (LSI) can be reduced by performing logic operation at low voltage as in a general circuit. Meanwhile, a signal output through an I/O terminal is required to be at a level similar to that of voltage of an external circuit to compensate a stable circuit operation or to perform voltage matching with the external circuit. In general, with the use of a DC-DC convertor circuit such as a boosting circuit or a level shifter, an internal low-voltage signal is changed to a high-voltage signal that is output to outside.

To reduce power consumption, it is very effective to stop power supply of a high-voltage circuit. However, when power supply of the high-voltage circuit is stopped, a power source system of the high-voltage circuit needs to be controlled by a low-voltage circuit. In the case where the low-voltage circuit operates in a low-voltage region where voltage is lower than or equal to threshold voltage, the on-state current of a transistor is extremely low; as a result, it takes a long time to drive a large load. Furthermore, the high-voltage circuit directly driven by the low-voltage circuit causes a problem in that, for example, shoot-through current is generated; thus, it is difficult to control driving of the high-voltage circuit by the low-voltage circuit. In Non-Patent Document 1, a level shifter configured to convert a low-voltage signal into a high-voltage signal at high speed is described as a solution of the above problems.

Reference

Non-Patent Document

[Non-Patent Document 1] "A Robust Low Power, High Speed Voltage Level Shifter With Built-in Short Circuit Current Reduction", *ECCTD* 2011, pp. 142-145.

SUMMARY OF THE INVENTION

However, in the above literature, off-leakage current of an n-channel silicon transistor (hereinafter, n-type Si-FET) is a main factor of an increase in power consumption of the level shifter in a standby mode. In view of the above, an object of one embodiment of the present invention is to reduce leakage current in a standby mode of a level shifter capable of operating with low voltage. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the descriptions of the specification, the drawings, the claims, and the like.

To solve the problems of the conventional technique, an n-type Si-FET and an oxide semiconductor transistor (hereinafter, OS-FET) are provided in series between an output signal line and a GND power line of a level shifter. Since the OS-FET has off-leakage current much lower than that of the n-type Si-FET, off-leakage current can be reduced even when an off-leakage current path is found in a standby mode. The potential of a gate electrode of the OS-FET is raised to a potential higher than input signal voltage by capacitive coupling with the output signal line, so that $V_{gs}$, and on-state current of the OS-FET are increased. Accordingly, the on-state current characteristics of the OS-FET are equal to or better than those of the n-type Si-FET; thus, the level shifter can operate with the response speed as fast as the conventional level shifter. Note that the level shifter has a circuit configuration with which the charge of the gate electrode whose potential is raised by capacitive coupling becomes floating to maintain the raised potential.

One embodiment of the present invention is a level shifter circuit including an n-channel silicon transistor and an oxide semiconductor transistor in series between an output signal line and a low potential power supply line. A potential of a gate electrode of the oxide semiconductor transistor is raised to a potential higher than input signal voltage by capacitive coupling to increase on-state current of the oxide semiconductor transistor.

Another embodiment of the present invention is a level shifter circuit including a first p-channel silicon transistor, a second p-channel silicon transistor, a first n-channel silicon transistor, a second n-channel silicon transistor, a fifth n-channel silicon transistor, a sixth n-channel silicon transistor, a seventh n-channel silicon transistor, an eighth n-channel silicon transistor, a first oxide semiconductor transistor, a second oxide semiconductor transistor, a third oxide semiconductor transistor, a fourth oxide semiconductor transistor, a first capacitor, a second capacitor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the seventh n-channel silicon transistor is electrically connected to the gate of the first p-channel silicon transistor. The other of the source and the drain of the seventh n-channel silicon transistor is electrically connected to the output signal line. A gate of the seventh n-channel silicon transistor is electrically connected to the high potential power supply line. One of a source and a drain of the eighth n-channel silicon transistor is electrically connected to the gate of the second p-channel silicon transistor. The other of the source and the drain of the eighth n-channel silicon transistor is electrically connected to the inverted output signal line. A gate of the eighth n-channel silicon transistor is electrically connected to the high potential power supply line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line. A first electrode of the first capacitor is electrically connected to the output signal line. A second electrode of the first capacitor is electrically connected to the gate of the third oxide semiconductor transistor. A first electrode of the second capacitor is electrically connected to the inverted output signal line. A second electrode of the second capacitor is electrically connected to the gate of the fourth oxide semiconductor transistor.

Another embodiment of the present invention is a level shifter circuit including a first p-channel silicon transistor, a second p-channel silicon transistor, a first n-channel silicon transistor, a second n-channel silicon transistor, a fifth n-channel silicon transistor, a sixth n-channel silicon transistor, a first oxide semiconductor transistor, a second oxide semiconductor transistor, a third oxide semiconductor transistor, a fourth oxide semiconductor transistor, a first capacitor, a second capacitor, a first resistor, a second resistor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line. A first terminal of the first resistor is electrically connected to the gate of the first p-channel silicon transistor. A second terminal of the first resistor is electrically connected to the output signal line. A first terminal of the second resistor is electrically connected to the gate of the second p-channel silicon transistor. A second terminal of the second resistor is electrically connected to the inverted output signal line. A first electrode of the first capacitor is electrically connected to the output signal line. A second electrode of the first capacitor is electrically connected to the gate of the third oxide semiconductor transistor. A first electrode of the second capacitor is electrically connected to the inverted output signal line. A second electrode of the second capacitor is electrically connected to the gate of the fourth oxide semiconductor transistor.

Another embodiment of the present invention is a level shifter circuit including a first p-channel silicon transistor, a second p-channel silicon transistor, a third p-channel silicon transistor, a fourth p-channel silicon transistor, a first n-channel silicon transistor, a second n-channel silicon transistor, a third n-channel silicon transistor, a fourth n-channel silicon transistor, a first oxide semiconductor transistor, a second oxide semiconductor transistor, a third oxide semiconductor transistor, a fourth oxide semiconductor transistor, a first capacitor, a second capacitor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to a gate of the fourth p-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to a gate of the third p-channel silicon transistor. One of a source and a drain of the third p-channel silicon transistor is electrically connected to the inverted output signal line. The other of the source and the drain of the third p-channel silicon transistor is electrically connected to the gate of the third p-channel silicon transistor. The gate of the third p-channel silicon transistor is electrically connected to one of a source and a drain of the third n-channel silicon transistor. One of a source and a drain of the fourth p-channel silicon transistor is electrically connected to the output signal line. The other of the source and the drain of the fourth p-channel silicon transistor is electrically connected to the gate of the fourth p-channel silicon transistor. The gate of the fourth p-channel silicon transistor is electrically connected to one of a source and a drain of the fourth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the third n-channel silicon transistor is electrically connected to the ground potential power line. A gate of the third n-channel silicon transistor is electrically connected to the input signal line. The other of the source and the drain of the fourth n-channel silicon transistor is electrically connected to the ground potential power line. A gate of the fourth n-channel silicon transistor is electrically connected to the inverted input signal line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line. A first electrode of the first capacitor is electrically connected to the output signal line. A second electrode of the first capacitor is electrically connected to the gate of the third oxide semiconductor transistor. A first electrode of the second capacitor is electrically connected to the inverted output signal line. A second electrode of the second capacitor is electrically connected to the gate of the fourth oxide semiconductor transistor.

Another embodiment of the present invention is a level shifter circuit including a first p-channel silicon transistor, a second p-channel silicon transistor, a third p-channel silicon transistor, a fourth p-channel silicon transistor, a first n-channel silicon transistor, a second n-channel silicon transistor, a third n-channel silicon transistor, a fourth n-channel silicon transistor, a fifth n-channel silicon transistor, a sixth n-channel silicon transistor, a seventh n-channel silicon transistor, an eighth n-channel silicon transistor, a first oxide semiconductor transistor, a second oxide semiconductor transistor, a third oxide semiconductor transistor, a fourth oxide semiconductor transistor, a first capacitor, a second capacitor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the third p-channel silicon transistor is electrically connected to the inverted output signal line. The other of the source and the drain of the third p-channel silicon transistor is electrically connected to a gate of the third p-channel silicon transistor. The gate of the third p-channel silicon transistor is electrically connected to one of a source and a drain of the third n-channel silicon transistor. One of a source and a drain of the fourth p-channel silicon transistor is electrically connected to the output signal line. The other of the source and the drain of the fourth p-channel silicon transistor is electrically connected to a gate of the fourth p-channel silicon transistor. The gate of the fourth p-channel silicon transistor is electrically connected to one of a source and a drain of the fourth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the third n-channel silicon transistor is electrically connected to the ground potential power line. A gate of the third n-channel silicon transistor is electrically connected to the input signal line. The other of the source and the drain of the fourth n-channel silicon transistor is electrically connected to the ground potential power line. A gate of the fourth n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the seventh n-channel silicon transistor is electrically connected to the gate of the first p-channel silicon transistor. The other of the source and the drain of the seventh n-channel silicon transistor is electrically connected to the gate of the fourth p-channel silicon transistor. A gate of the seventh n-channel silicon transistor is electrically connected to the high potential power supply line. One of a source and a drain of the eighth n-channel silicon transistor is electrically connected to the gate of the second p-channel silicon transistor. The other of the source and the drain of the eighth n-channel silicon transistor is electrically connected to the gate of the third p-channel silicon transistor. A gate of the eighth n-channel silicon transistor is electrically connected to the high potential power supply line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line. A first electrode of the first capacitor is electrically connected to the output signal line. A second electrode of the first capacitor is electrically connected to the gate of the third oxide semiconductor transistor. A first electrode of the second capacitor is electrically connected to the inverted output signal line. A second electrode of the second capacitor is electrically connected to the gate of the fourth oxide semiconductor transistor.

Another embodiment of the present invention is a level shifter circuit including a first p-channel silicon transistor, a second p-channel silicon transistor, a first n-channel silicon transistor, a second n-channel silicon transistor, a fifth n-channel silicon transistor, a sixth n-channel silicon transistor, a seventh n-channel silicon transistor, an eighth n-channel silicon transistor, a first oxide semiconductor transistor, a second oxide semiconductor transistor, a third oxide semiconductor transistor, a fourth oxide semiconductor transistor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the seventh n-channel silicon transistor is electrically connected to the gate of the first p-channel silicon transistor. The other of the source and the drain of the seventh n-channel silicon transistor is electrically connected to the output signal line. A gate of the seventh n-channel silicon transistor is electrically connected to the high potential power supply line. One of a source and a drain of the eighth n-channel silicon transistor is electrically connected to the gate of the second p-channel silicon transistor. The other of the source and the drain of the eighth n-channel silicon transistor is electrically connected to the inverted output signal line. A gate of the eighth n-channel silicon transistor is electrically connected to the high potential power supply line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line.

Another embodiment of the present invention is a level shifter circuit including a first p-channel silicon transistor, a second p-channel silicon transistor, a first n-channel silicon transistor, a second n-channel silicon transistor, a fifth n-channel silicon transistor, a sixth n-channel silicon transistor, a first oxide semiconductor transistor, a second oxide semiconductor transistor, a third oxide semiconductor transistor, a fourth oxide semiconductor transistor, a first resistor, a second resistor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line. A first terminal of the first resistor is electrically connected to the gate of the first p-channel silicon transistor. A second terminal of the first resistor is electrically connected to the output signal line. A first terminal of the second resistor is electrically connected to the gate of the second p-channel silicon transistor. A second terminal of the second resistor is electrically connected to the inverted output signal line.

Another embodiment of the present invention is a level shifter circuit including a first p-channel silicon transistor, a second p-channel silicon transistor, a third p-channel silicon transistor, a fourth p-channel silicon transistor, a first n-channel silicon transistor, a second n-channel silicon transistor, a third n-channel silicon transistor, a fourth n-channel silicon transistor, a first oxide semiconductor transistor, a second oxide semiconductor transistor, a third oxide semiconductor transistor, a fourth oxide semiconductor transistor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to a gate of the fourth p-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to a gate of the third p-channel silicon transistor. One of a source and a drain of the third p-channel silicon transistor is electrically connected to the inverted output signal line. The other of the source and the drain of the third p-channel silicon transistor is electrically connected to the gate of the third p-channel silicon transistor. The gate of the third p-channel silicon transistor is electrically connected to one of a source and a drain of the third n-channel silicon transistor. One of a source and a drain of the fourth p-channel silicon transistor is electrically connected to the output signal line. The other of the source and the drain of the fourth p-channel silicon transistor is electrically connected to the gate of the fourth p-channel silicon transistor. The gate of the fourth p-channel silicon transistor is electrically connected to one of a source and a drain of the fourth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the third n-channel silicon transistor is electrically connected to the ground potential power line. A gate of the third n-channel silicon transistor is electrically connected to the input signal line. The other of the source and the drain of the fourth n-channel silicon transistor is electrically connected to the ground potential power line. A gate of the fourth n-channel silicon transistor is electrically connected to the inverted input signal line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line.

Another embodiment of the present invention is a level shifter circuit including a first p-channel silicon transistor, a second p-channel silicon transistor, a third p-channel silicon transistor, a fourth p-channel silicon transistor, a first n-channel silicon transistor, a second n-channel silicon transistor, a third n-channel silicon transistor, a fourth n-channel silicon transistor, a fifth n-channel silicon transistor, a sixth n-channel silicon transistor, a seventh n-channel silicon transistor, an eighth n-channel silicon transistor, a first oxide semiconductor transistor, a second oxide semiconductor transistor, a third oxide semiconductor transistor, a fourth oxide semiconductor transistor, a high potential power supply line, a ground potential power line, a low potential power supply line, an output signal line, an inverted output signal line, an input signal line, and an inverted input signal line. One of a source and a drain of the first p-channel silicon transistor is electrically connected to the high potential power supply line. The other of the source and the drain of the first p-channel silicon transistor is electrically connected to the inverted output signal line. A gate of the first p-channel silicon transistor is electrically connected to one of a source and a drain of the sixth n-channel silicon transistor. One of a source and a drain of the second p-channel silicon transistor is electrically connected to the high potential power supply line. The other of the source and the drain of the second p-channel silicon transistor is electrically connected to the output signal line. A gate of the second p-channel silicon transistor is electrically connected to one of a source and a drain of the fifth n-channel silicon transistor. One of a source and a drain of the third p-channel silicon transistor is electrically connected to the inverted output signal line. The other of the source and the drain of the third p-channel silicon transistor is electrically connected to a gate of the third p-channel silicon transistor. The gate of the third p-channel silicon transistor is electrically connected to one of a source and a drain of the third n-channel silicon transistor. One of a source and a drain of the fourth p-channel silicon transistor is electrically connected to the output signal line. The other of the source and the drain of the fourth p-channel silicon transistor is electrically connected to a gate of the fourth p-channel silicon transistor. The gate of the fourth p-channel silicon transistor is electrically connected to one of a source and a drain of the fourth n-channel silicon transistor. One of a source and a drain of the first n-channel silicon transistor is electrically connected to the inverted output signal line. The other of the source and the drain of the first n-channel silicon transistor is electrically connected to one of a source and a drain of the third oxide semiconductor transistor. A gate of the first n-channel silicon transistor is electrically connected to the input signal line. One of a source and a drain of the second n-channel silicon transistor is electrically connected to the output signal line. The other of the source and the drain of the second n-channel silicon transistor is electrically connected to one of a source and a drain of the fourth oxide semiconductor transistor. A gate of the second n-channel silicon transistor is electrically connected to the inverted input signal line. The other of the source and the drain of the third n-channel silicon transistor is electrically connected to the ground potential power line. A gate of the third n-channel silicon transistor is electrically connected to the input signal line. The other of the source and the drain of the fourth n-channel silicon transistor is electrically connected to the ground potential power line. A gate of the fourth n-channel silicon transistor is electrically connected to the inverted input signal line. The other of the source and the drain of the fifth n-channel silicon transistor is electrically connected to the ground potential power line. A gate of the fifth n-channel silicon transistor is electrically connected to the input signal line. The other of the source and the drain of the sixth n-channel silicon transistor is electrically connected to the ground potential power line. A gate of the sixth n-channel silicon transistor is electrically connected to the inverted input signal line. One of a source and a drain of the seventh n-channel silicon transistor is electrically connected to the gate of the fourth p-channel silicon transistor. A gate of the seventh n-channel silicon transistor is electrically connected to the high potential power supply line. One of a source and a drain of the eighth n-channel silicon transistor is electrically connected to the gate of the second p-channel silicon transistor. The other of the source and the drain of the eighth n-channel silicon transistor is electrically connected to the gate of the third p-channel silicon transistor. A gate of the eighth n-channel silicon transistor is electrically connected to the high potential power supply line. One of a source and a drain of the first oxide semiconductor transistor is electrically connected to the input signal line. The other of the source and the drain of the first oxide semiconductor transistor is electrically connected to a gate of the third oxide semiconductor transistor. A gate of the first oxide semiconductor transistor is electrically connected to the low potential power supply line. One of a source and a drain of the second oxide semiconductor transistor is electrically connected to the inverted input signal line. The other of the source and the drain of the second oxide semiconductor transistor is electrically connected to a gate of the fourth oxide semiconductor transistor. A gate of the second oxide semiconductor transistor is electrically connected to the low potential power supply line. The other of the source and the drain of the third oxide semiconductor transistor is electrically connected to the ground potential power line. The other of the source and the drain of the fourth oxide semiconductor transistor is electrically connected to the ground potential power line.

One embodiment of the present invention reduces static leakage current by providing an n-type Si-FET and an OS-FET in series in an off-leakage current path to reduce power consumption. Another embodiment of the present invention provides a novel semiconductor device. Note that the descriptions of these effects do not disturb the existence of other effects. One embodiment of the present invention does not necessarily achieve all the above effects. Other effects will be apparent from and can be derived from the descriptions of the specification, the drawings, the claims, and the like.

DETAILED DESCRIPTION OF THE INVENTION (Embodiment 1)

A level shifter of one embodiment of the present invention will be described with reference to FIG. 1.

Figure 1:
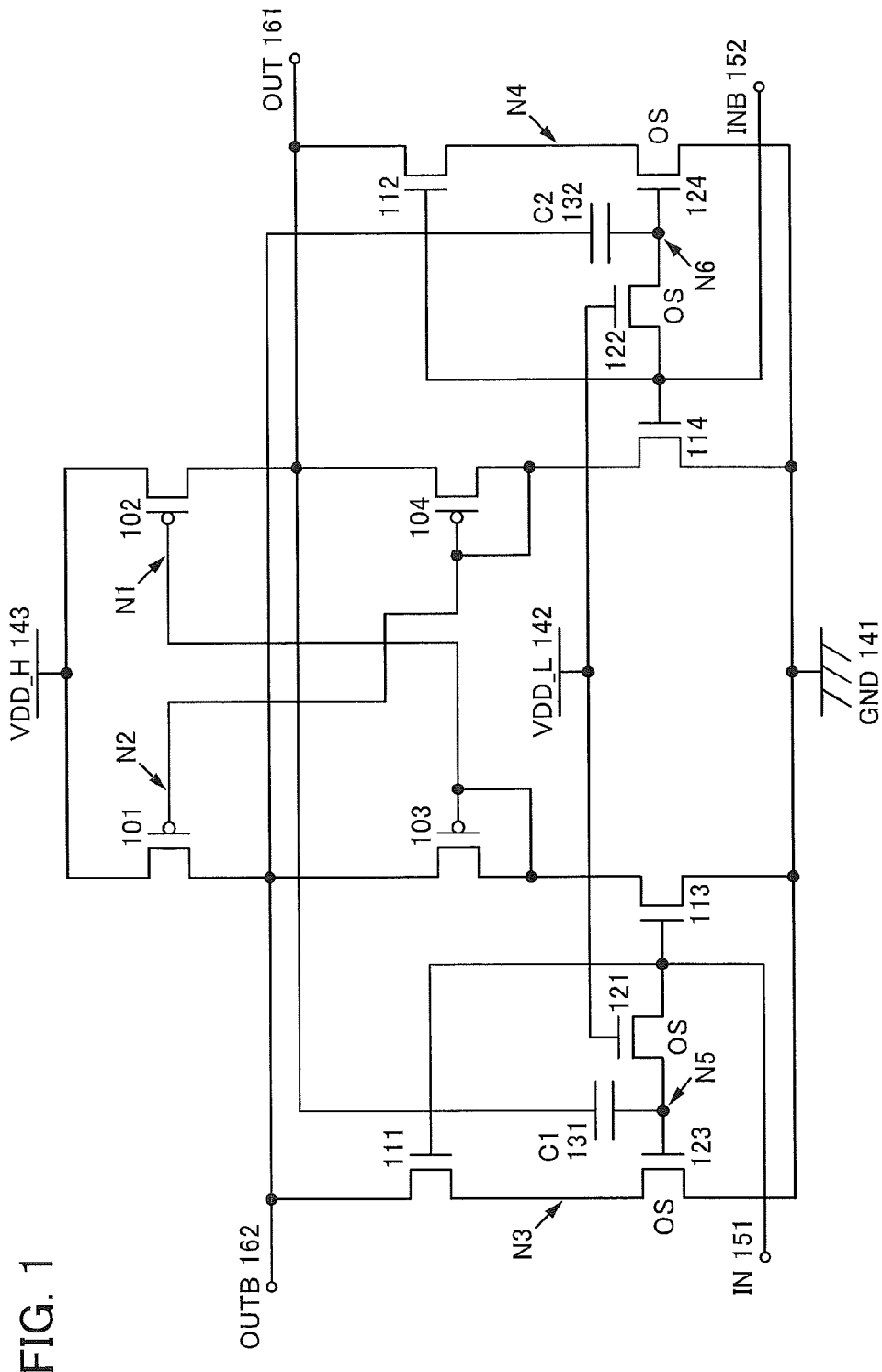
FIG. 1 is a circuit diagram of a level shifter of one embodiment of the present invention.

FIG. 1 is a circuit diagram of the level shifter of one embodiment of the present invention. The level shifter of one embodiment of the present invention includes a first p-channel silicon transistor (hereinafter, p-type Si-FET) 101, a second p-type Si-FET 102, a third p-type Si-FET 103, a fourth p-type Si-FET 104, a first n-channel silicon transistor (hereinafter, n-type Si-FET) 111, a second n-type Si-FET 112, a third n-type Si-FET 113, a fourth n-type Si-FET 114, a first oxide semiconductor transistor (hereinafter, OS-FET) 121, a second OS-FET 122, a third OS-FET 123, a fourth OS-FET 124, a first capacitor (C1) 131, a second capacitor (C2) 132, a ground power supply line (GND) 141, a low potential power supply line (VDD_L) 142, a high potential power supply line (VDD_H) 143, an input signal line (IN) 151, an inverted input signal line (INB) 152, an output signal line (OUT) 161, and an inverted output signal line (OUTB) 162.

A gate terminal of the first p-type Si-FET 101 is connected to a gate terminal of the fourth p-type Si-FET 104, the other of source and drain terminals of the fourth p-type Si-FET 104, and one of source and drain terminals of the fourth n-type Si-FET 114. One of source and drain terminals of the first p-type Si-FET 101 is connected to the high potential power supply line (VDD_H) 143. The other of the source and drain terminals of the first p-type Si-FET 101 is connected to one of source and drain terminals of the third p-type Si-FET 103, one of source and drain terminals of the first n-type Si-FET 111, one terminal of the second capacitor (C2) 132, and the inverted output signal line (OUTB) 162. Note that a node to which the gate terminal of the first p-type Si-FET 101 is connected can be referred to as N2.

A gate terminal of the second p-type Si-FET 102 is connected to a gate terminal of the third p-type Si-FET 103, the other of the source and drain terminals of the third p-type Si-FET 103, and one of source and drain terminals of the third n-type Si-FET 113. One of source and drain terminals of the second p-type Si-FET 102 is connected to the high potential power supply line (VDD_H) 143. The other of the source and drain teuninals of the second p-type Si-FET 102 is connected to one of the source and drain terminals of the fourth p-type Si-FET 104, one of source and drain terminals of the second n-type Si-FET 112, one terminal of the first capacitor (C1) 131, and the output signal line (OUT) 161. Note that a node to which the gate terminal of the second p-type Si-FET 102 is connected can be referred to as N1.

A gate terminal of the first n-type Si-FET 111 is connected to the input signal line (IN) 151, a gate terminal of the third n-type Si-FET 113, and one of source and drain terminals of the first OS-FET 121. The other of the source and drain teiminals of the first n-type Si-FET 111 is connected to one of source and drain terminals of the third OS-FET 123. Note that a node to which the other of the source and drain terminals of the first n-type Si-FET 111 is connected can be referred to as N3.

A gate terminal of the second n-type Si-FET 112 is connected to the inverted input signal line (INB) 152, a gate terminal of the fourth n-type Si-FET 114, and one of source and drain terminals of the second OS-FET 122. The other of the source and drain terminals of the second n-type Si-FET 112 is connected to one of source and drain terminals of the fourth OS-FET 124. Note that a node to which the other of the source and drain terminals of the second n-type Si-FET 112 is connected can be referred to as N4.

The other of the source and drain terminals of the third n-type Si-FET 113 is connected to the ground power supply line (GND) 141.

The other of the source and drain teiminals of the fourth n-type Si-FET 114 is connected to the ground power supply line (GND) 141.

A gate terminal of the first OS-FET 121 is connected to the low potential power supply line (VDD_L) 142. The other of the source and drain terminals of the first OS-FET 121 is connected to a gate terminal of the third OS-FET 123 and the other terminal of the first capacitor (C1) 131. Note that a node to which the other of the source and drain terminals of the first OS-FET 121 is connected can be referred to as N5.

A gate terminal of the second OS-FET 122 is connected to the low potential power supply line (VDD_L) 142. The other of the source and drain teiminals of the second OS-FET 122 is connected to a gate terminal of the fourth OS-FET 124 and the other terminal of the second capacitor (C2) 132. Note that a node to which the other of the source and drain terminals of the second OS-FET 122 is connected can be referred to as N6.

The other of the source and drain terminals of the third OS-FET 123 is connected to the ground power supply line (GND) 141.

The other of the source and drain terminals of the fourth OS-FET 124 is connected to the ground power supply line (GND) 141.

The first p-type Si-FET 101 has a function of controlling power supply of the high potential power supply line (VDD_H) 143 in accordance with the potential of N2.

The second p-type Si-FET 102 has a function of controlling power supply of the high potential power supply line (VDD_H) 143 in accordance with the potential of N1.

The third p-type Si-FET 103, which is a diode-connected transistor, has a function of limiting supply of the potential of the high potential power supply line (VDD_H) 143 through the first p-type Si-FET 101 so as not to raise the potential of N1 to the potential of the high potential power supply line (VDD_H) 143, leading to easy supply of the potential of the ground power supply line (GND) 141 through the third n-type Si-FET 113.

The fourth p-type Si-FET 104, which is a diode-connected transistor, has a function of limiting supply of the potential of the high potential power supply line (VDD_H) 143 through the second p-type Si-FET 102 so as not to raise the potential of N2 to the potential of the high potential power supply line (VDD_H) 143, leading to easy supply of the potential of the ground power supply line (GND) 141 through the fourth n-type Si-FET 114.

The first n-type Si-FET 111 has a function of being off more quickly than the third OS-FET 123 to prevent shoot-through current.

The second n-type Si-FET 112 has a function of being off more quickly than the fourth OS-FET 124 to prevent shoot-through current.

The third n-type Si-FET 113 has a function of controlling power supply of the ground power supply line (GND) 141 to N1.

The fourth n-type Si-FET 114 has a function of controlling power supply of the ground power supply line (GND) 141 to N2.

The first OS-FET 121 has a function of being off to hold the potential of N5 when the potential of the IN 151 is an H potential and the potential of N5 is raised to a potential higher than the potential of the low potential power supply line (VDD_L) 142 by capacitive coupling.

The second OS-FET 122 has a function of being off to hold the potential of N6 when the potential of the INB 152 is an H potential and the potential of N6 is raised to a potential higher than the potential of the low potential power supply line (VDD_L) 142 by capacitive coupling.

The third OS-FET 123 has a function of reducing off-leakage current.

The fourth OS-FET 124 has a function of reducing off-leakage current.

The first capacitor (C1) 131 between N5 and the OUT 161 has a function of supplying a high potential due to capacitive coupling to N5 to increase the on-state current of the third OS-FET 123. Note that parasitic capacitance or the like between wirings can be used instead of the first capacitor (C1) 131 as long as the potential rise due to capacitive coupling is sufficient.

The second capacitor (C2) 132 between N6 and the OUTB 162 has a function of supplying a high potential due to capacitive coupling to N6 to increase the on-state current of the fourth OS-FET 124. Note that parasitic capacitance or the like between wirings can be used instead of the second capacitor (C2) 132 as long as the potential rise due to capacitive coupling is sufficient.

Note that this embodiment can be implemented in appropriate combination with other embodiments.

(Embodiment 2)

Figure 2:
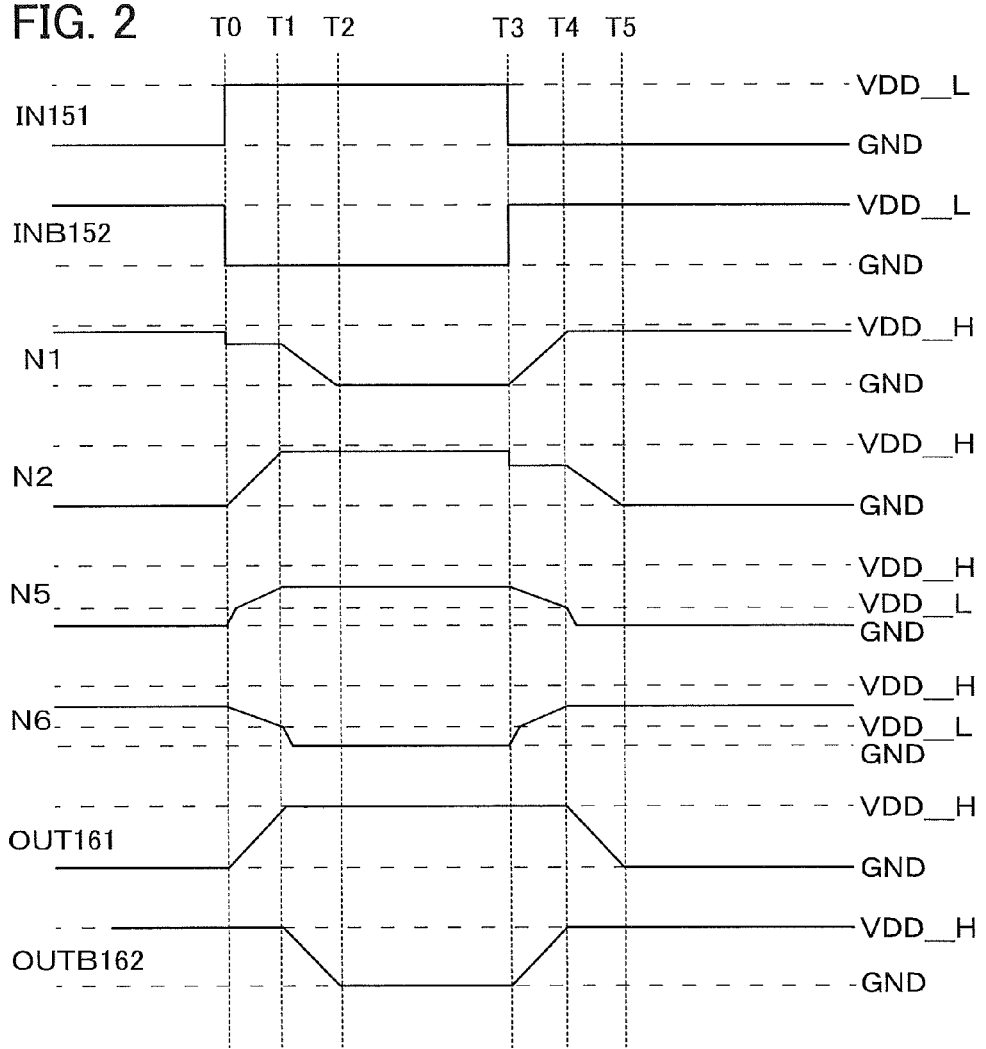
FIG. 2 is a timing chart showing the operation of a level shifter circuit of one embodiment of the present invention.

The circuit operation of the level shifter illustrated in FIG. 1 will be described using a timing chart in FIG. 2.

In an initial state, the potential of the IN 151 is an L potential and the potential of the INB 152 is an H potential. Since signals supplied to the IN 151 and the INB 152 are based on a low potential power supply circuit, an H potential is the potential of the low potential power supply line (VDD_L) 142. The potential of N1 is an H potential at this time; a potential lower than the potential of the high potential power supply line (VDD_H) 143 by the threshold voltage of the third p-type Si-FET 103 is applied to N1. The potentials of N2 and N5 are L potentials. A potential higher than the potential of the low potential power supply line (VDD_L) 142, which is an H potential and an input signal, is applied to the potential of N6 because of capacitive coupling with the OUTB 162.

When the potential of the IN 151 becomes an H potential at Time T0, the first n-type Si-FET 111, the third n-type Si-FET 113, and the third OS-FET 123 are turned on. When the potential of the INB 152 becomes an L potential at Time T0, the second n-type Si-FET 112 and the fourth n-type Si-FET 114 are turned off. The fourth OS-FET 124 is supplied with the potential of the INB 152 through the second OS-FET 122 and remains an on state until its gate potential decreases to an L potential (GND). Note that how long the fourth OS-FET 124 remains the on state depends on the on-state current of the second OS-FET 122. When the potential of the IN 151 becomes an H potential and the third n-type Si-FET 113 is turned on, the potential N1 decreases. As a result, the potential of the high potential power supply line (VDD_H) 143 is supplied to the OUT 161 through the second p-type Si-FET 102 and the potential of the OUT 161 starts to rise. When the potential of the OUT 161 rises, the potential of the high potential power supply line (VDD_H) 143 is supplied to N2 through the fourth p-type Si-FET 104.

In addition, when the potential of the IN 151 becomes an H potential, the potential of N5 rises to the same level as the potential of the low potential power supply line (VDD_L) 142. Furthermore, when the potential of the OUT 161 rises, capacitive coupling occurs through the first capacitor (C1) 131 and the potential of N5 rises to a potential higher than the potential of the low potential power supply line (VDD_L) 142. As a result, the on-state current of the third OS-FET 123 becomes higher than that of the first n-type Si-FET 111, leading to a boosting operation with the response speed as fast as that of the conventional level shifter.

Between Time T0 and Time T1, the high potential power supply line (VDD_H) 143 is connected to the ground power supply line (GND) 141 through the first p-type Si-FET 101, the first n-type Si-FET 111, and the third OS-FET 123; thus, shoot-through current is generated. The amount of the shoot-through current depends on the on-state current of the first n-type Si-FET 111 or the on-state current of the third OS-FET 123, whichever is lower. Note that since an n-type Si-FET with low potential power supply driving and a p-type Si-FET with high potential power supply driving have different $V_{gs}$, the n-type Si-FET that supplies the potential of the ground power supply line (GND) 141 has higher on-state current than the p-type Si-FET that supplies the potential of the high potential power supply line (VDD_H) 143; thus, the potential of the OUTB 162 remains an H potential even when shoot-through current is generated. Similarly, since the first p-type Si-FET 101 and the third p-type Si-FET 103 that supply the potential of the high potential power supply line (VDD_H) 143 have higher on-state current than the third n-type Si-FET 113 that supplies the potential of the ground power supply line (GND) 141, the potential of N1 remains an H potential.

When the potential of N2 rises to a potential lower than the potential of the high potential power supply line (VDD_H) 143 by the threshold voltage of the fourth p-type Si-FET 104 at Time T1, the first p-type Si-FET 101 is turned off. Thus, power supply from the high potential power supply line (VDD_H) 143 to the OUTB 162 is stopped and power is supplied from the ground power supply line (GND) 141 through the first n-type Si-FET 111 and the third OS-FET 123 instead; as a result, the potential of the OUTB 162 is decreased. When the potential of the OUTB 162 is decreased, the potential of N6 is decreased by capacitive coupling through the second capacitor (C2) 132. If the potential of N6 is at the same level as the potential of the ground power supply line (GND) 141, i.e., an L potential, the potential remains at the level. When the potential of N6 becomes an L potential, the fourth OS-FET 124 is turned off. Since an OS-FET has off-state current much lower than that of a Si-FET, the amount of current which leaks to the ground power supply line (GND) 141 can be reduced and a reduction in H potential of the OUT 161 can be suppressed. Note that the potential of N4 gradually rises because of off-leakage current of the second n-type Si-FET 112, and as the potential of N4 rises, $V_{ds}$ of the second n-type Si-FET 112 and $V_{ds}$ of the fourth OS-FET 124 change. This means that the value of off-state current changes depending on the $V_{ds}$ characteristics of the second n-type Si-FET 112.

When the first p-type Si-FET 101 is turned off, the potential of the ground power supply line (GND) 141 is supplied through the third n-type Si-FET 113; thus, the potential of N1 is decreased when the potential of the OUTB 162 changes.

The potentials of the OUTB 162, N1, and N6 become L potentials at Time T2, whereby boosting of a low potential signal terminates.

Operations during Time T3 to Time T5 are the same as those during Time T0 to Time T2 except for elements and nodes used for the operations because the circuit in FIG. 1 has bilateral symmetry; thus, the descriptions thereof are omitted.

With the above circuit operation, a gate potential is raised by capacitive coupling when the fourth OS-FET 124 or the third OS-FET 123 is turned on so that the fourth OS-FET 124 or the third OS-FET 123 have higher on-state current than the n-type Si-FET. Thus, the level shifter can perform a normal operation with the response speed as fast as that of the conventional level shifter even though including OS-FETs. In addition, since an OS-FET has off-state current much lower than that of an n-type Si-FET, the amount of current that leaks to the ground power supply line (GND) 141 when the potential of the OUT 161 or the OUTB 162 is an H potential can be reduced by turning off the fourth OS-FET 124 or the third OS-FET 123. As a result, power consumption in a standby mode during which a fixed potential is output can be reduced.

Note that this embodiment can be implemented in appropriate combination with other embodiments.

(Embodiment 3)

Another configuration of the level shifter of one embodiment of the present invention will be described with reference to FIG. 3.

Figure 3:
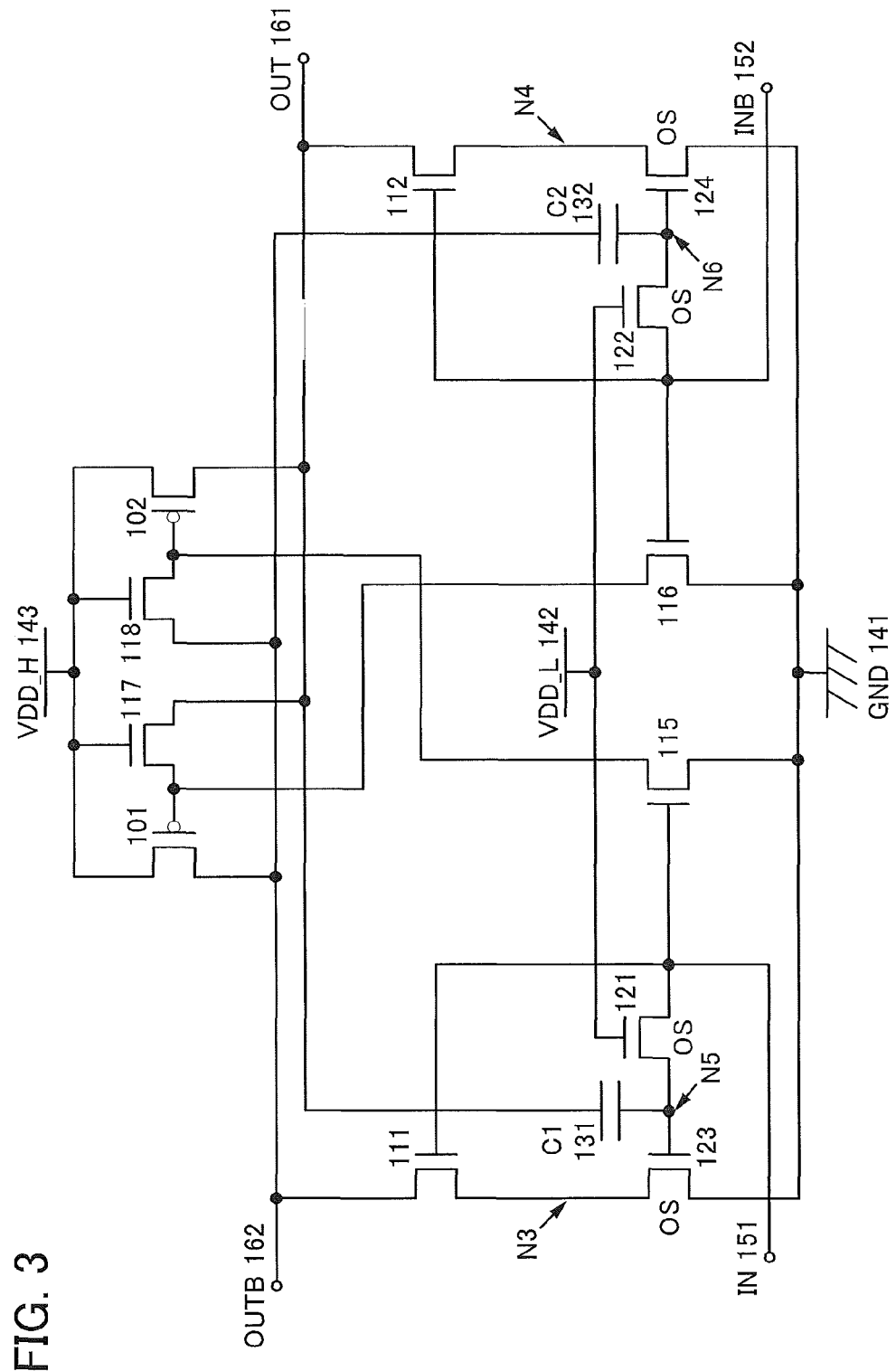
FIG. 3 is a circuit diagram of a level shifter of one embodiment of the present invention.

FIG. 3 is a circuit diagram of the level shifter. The level shifter of one embodiment of the present invention includes the first p-type Si-FET 101, the second p-type Si-FET 102, the first n-type Si-FET 111, the second n-type Si-FET 112, a fifth n-type Si-FET 115, a sixth n-type Si-FET 116, a seventh n-type Si-FET 117, an eighth n-type Si-FET 118, the first OS-FET 121, the second OS-FET 122, the third OS-FET 123, the fourth OS-FET 124, the first capacitor (C1) 131, the second capacitor (C2) 132, the ground power supply line (GND) 141, the low potential power supply line (VDD_L) 142, the high potential power supply line (VDD_H) 143, the input signal line (IN) 151, the inverted input signal line (INB) 152, the output signal line (OUT) 161, and the inverted output signal line (OUTB) 162.

The gate terminal of the first p-type Si-FET 101 is connected to one of source and drain terminals of the sixth n-type Si-FET 116 and one of source and drain terminals of the seventh n-type Si-FET 117. One of the source and drain terminals of the first p-type Si-FET 101 is connected to the high potential power supply line (VDD_H) 143. The other of the source and drain terminals of the first p-type Si-FET 101 is connected to one of source and drain terminals of the first n-type Si-FET 111, the other of source and drain terminals of the eighth n-type Si-FET 118, one terminal of the second capacitor (C2) 132, and the inverted output signal line (OUTB) 162.

The gate terminal of the second p-type Si-FET 102 is connected to one of source and drain terminals of the fifth n-type Si-FET 115 and one of the source and drain terminals of the eighth n-type Si-FET 118. One of the source and drain terminals of the second p-type Si-FET 102 is connected to the high potential power supply line (VDD_H) 143. The other of the source and drain terminals of the second p-type Si-FET 102 is connected to one of the source and drain terminals of the second n-type Si-FET 112, the other of the source and drain terminals of the seventh n-type Si-FET 117, one terminal of the first capacitor (C1) 131, and the output signal line (OUT) 161.

The gate terminal of the first n-type Si-FET 111 is connected to the input signal line (IN) 151, a gate terminal of the fifth n-type Si-FET 115, and one of the source and drain terminals of the first OS-FET 121. The other of the source and drain terminals of the first n-type Si-FET 111 is connected to one of the source and drain terminals of the third OS-FET 123. Note that a node to which the other of the source and drain terminals of the first n-type Si-FET 111 is connected can be referred to as N3.

The gate terminal of the second n-type Si-FET 112 is connected to the inverted input signal line (INB) 152, a gate terminal of the sixth n-type Si-FET 116, and one of the source and drain terminals of the second OS-FET 122. The other of the source and drain terminals of the second n-type Si-FET 112 is connected to one of the source and drain terminals of the fourth OS-FET 124. Note that a node to which the other of the source and drain terminals of the second n-type Si-FET 112 is connected can be referred to as N4.

The other of the source and drain terminals of the fifth n-type Si-FET 115 is connected to the ground power supply line (GND) 141.

The other of the source and drain terminals of the sixth n-type Si-FET 116 is connected to the ground power supply line (GND) 141.

A gate terminal of the seventh n-type Si-FET 117 is connected to the high potential power supply line (VDD_H) 143.

A gate terminal of the eighth n-type Si-FET 118 is connected to the high potential power supply line (VDD_H) 143.

The gate terminal of the first OS-FET 121 is connected to the low potential power supply line (VDD_L) 142. The other of the source and drain terminals of the first OS-FET 121 is connected to the gate terminal of the third OS-FET 123 and the other terminal of the first capacitor (C1) 131. Note that a node to which the other of the source and drain terminals of the first OS-FET 121 is connected can be referred to as N5.

The gate terminal of the second OS-FET 122 is connected to the low potential power supply line (VDD_L) 142. The other of the source and drain terminals of the second OS-FET 122 is connected to the gate terminal of the fourth OS-FET 124 and the other terminal of the second capacitor (C2) 132. Note that a node to which the other of the source and drain terminals of the second OS-FET 122 is connected can be referred to as N6.

The other of the source and drain terminals of the third OS-FET 123 is connected to the ground power supply line (GND) 141.

The other of the source and drain terminals of the fourth OS-FET 124 is connected to the ground power supply line (GND) 141.

The first p-type Si-FET 101 has a function of controlling power supply of the high potential power supply line (VDD_H) 143 in accordance with the potential of the gate terminal of the first p-type Si-FET 101.

The second p-type Si-FET 102 has a function of controlling power supply of the high potential power supply line (VDD_H) 143 in accordance with the potential of the gate terminal of the second p-type Si-FET 102.

The first n-type Si-FET 111 has a function of being off more quickly than the third OS-FET 123 to prevent shoot-through current.

The second n-type Si-FET 112 has a function of being off more quickly than the fourth OS-FET 124 to prevent shoot-through current.

The fifth n-type Si-FET 115 has a function of facilitating the transition operation of the level shifter by applying the potential of the ground power supply line (GND) 141 directly to the gate terminal of the second p-type Si-FET 102.

The sixth n-type Si-FET 116 has a function of facilitating the transition operation of the level shifter by applying the potential of the ground power supply line (GND) 141 directly to the gate terminal of the first p-type Si-FET 101.

The seventh n-type Si-FET 117 serves as a variable resistor whose resistance changes in accordance with the potential of the source or the drain and has a function of facilitating the transition operation of the level shifter.

The eighth n-type Si-FET 118 serves as a variable resistor whose resistance changes in accordance with the potential of the source or the drain and has a function of facilitating the transition operation of the level shifter.

The first OS-FET 121 has a function of being off to hold the potential of N5 when the potential of the input signal line (IN) 151 is an H potential and the potential of N5 is raised to a potential higher than the potential of the low potential power supply line (VDD_L) 142 by capacitive coupling.

The second OS-FET 122 has a function of being off to hold the potential of N6 when the potential of the inverted input signal line (INB) 152 is an H potential and the potential of N6 is raised to a potential higher than the potential of the low potential power supply line (VDD_L) 142 by capacitive coupling.

The third OS-FET 123 has a function of reducing off-leakage current.

The fourth OS-FET 124 has a function of reducing off-leakage current.

The first capacitor (C1) 131 between N5 and the output signal line (OUT) 161 has a function of supplying a high potential due to capacitive coupling to N5 to increase the on-state current of the third OS-FET 123. Note that parasitic capacitance or the like between wirings can be used instead of the first capacitor (C1) 131 as long as the potential rise due to capacitive coupling is sufficient.

The second capacitor (C2) 132 between N6 and the inverted output signal line (OUTB) 162 has a function of generating a high potential due to capacitive coupling to N6 to increase the on-state current of the fourth OS-FET 124. Note that parasitic capacitance or the like between wirings can be used instead of the second capacitor (C2) 132 as long as the potential rise due to capacitive coupling is sufficient.

Note that this embodiment can be implemented in appropriate combination with other embodiments.

(Embodiment 4)

Another configuration of the level shifter of one embodiment of the present invention will be described with reference to FIG. 4.

Figure 4:
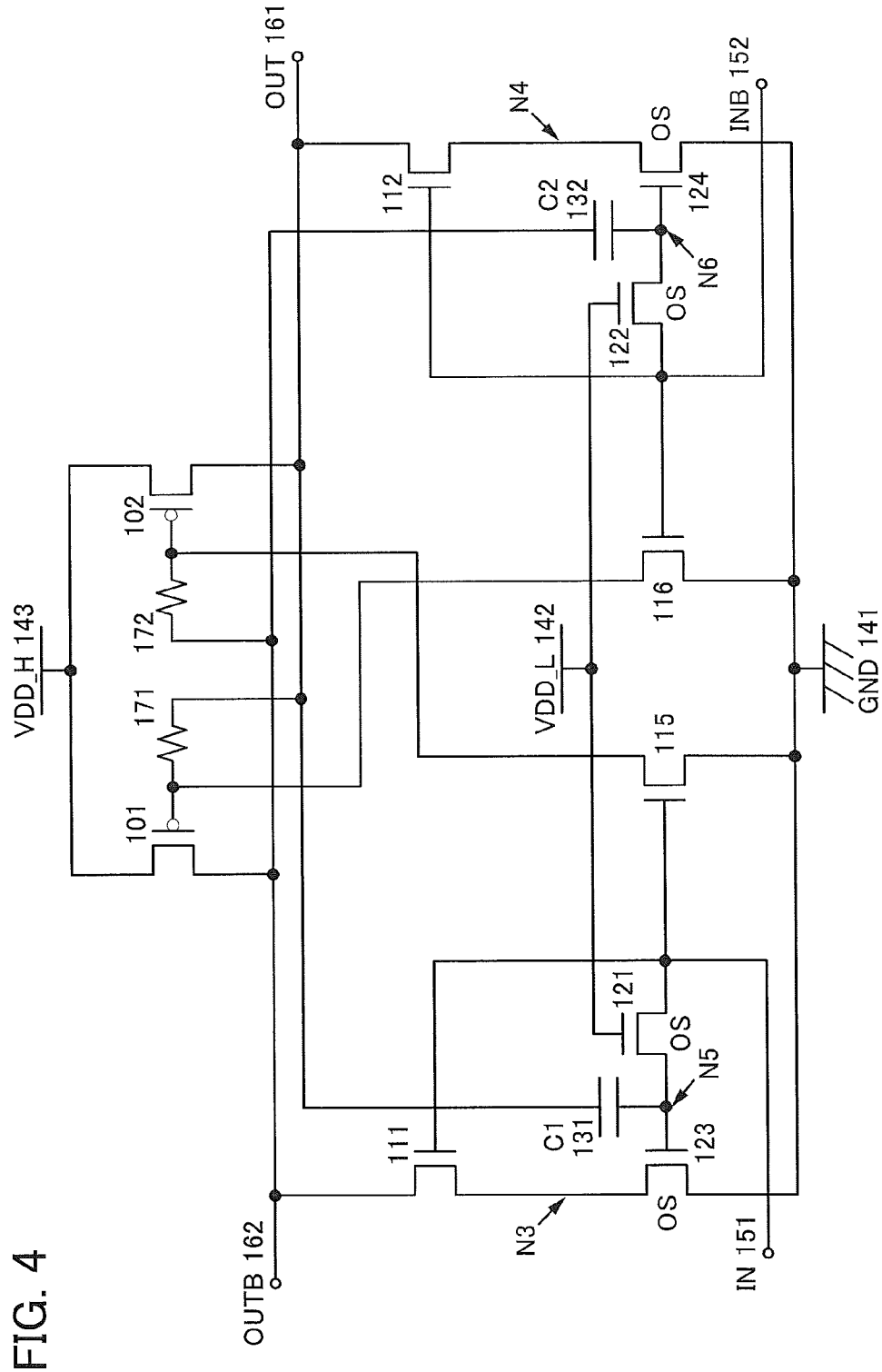
FIG. 4 is a circuit diagram of a level shifter of one embodiment of the present invention.

FIG. 4 is a circuit diagram of the level shifter. The level shifter of one embodiment of the present invention includes the first p-type Si-FET 101, the second p-type Si-FET 102, the first n-type Si-FET 111, the second n-type Si-FET 112, the fifth n-type Si-FET 115, the sixth n-type Si-FET 116, the first OS-FET 121, the second OS-FET 122, the third OS-FET 123, the fourth OS-FET 124, the first capacitor (C1) 131, the second capacitor (C2) 132, a first resistor 171, a second resistor 172, the ground power supply line (GND) 141, the low potential power supply line (VDD_L) 142, the high potential power supply line (VDD_H) 143, the input signal line (IN) 151, the inverted input signal line (INB) 152, the output signal line (OUT) 161, and the inverted output signal line (OUTB) 162.

The gate terminal of the first p-type Si-FET 101 is connected to one of the source and drain terminals of the sixth n-type Si-FET 116 and one terminal of the first resistor 171. One of the source and drain terminals of the first p-type Si-FET 101 is connected to the high potential power supply line (VDD_H) 143. The other of the source and drain terminals of the first p-type Si-FET 101 is connected to one of the source and drain terminals of the first n-type Si-FET 111, one terminal of the second resistor 172, one terminal of the second capacitor (C2) 132, and the inverted output signal line (OUTB) 162.

The gate terminal of the second p-type Si-FET 102 is connected to one of the source and drain terminals of the fifth n-type Si-FET 115 and the other terminal of the second resistor 172. One of the source and drain terminals of the second p-type Si-FET 102 is connected to the high potential power supply line (VDD_H) 143. The other of the source and drain terminals of the second p-type Si-FET 102 is connected to one of the source and drain terminals of the second n-type Si-FET 112, the other terminal of the first resistor 171, one terminal of the first capacitor (C1) 131, and the output signal line (OUT) 161.

The gate terminal of the first n-type Si-FET 111 is connected to the input signal line (IN) 151, one of the source and drain terminals of the first OS-FET 121, and the gate terminal of the fifth n-type Si-FET 115. The other of the source and drain terminals of the first n-type Si-FET 111 is connected to one of the source and drain terminals of the third OS-FET 123. Note that a node to which the other of the source and drain terminals of the first n-type Si-FET 111 is connected can be referred to as N3.

The gate terminal of the second n-type Si-FET 112 is connected to the inverted input signal line (INB) 152, one of the source and drain terminals of the second OS-FET 122, and the gate terminal of the sixth n-type Si-FET 116. The other of the source and drain terminals of the second n-type Si-FET 112 is connected to one of the source and drain terminals of the fourth OS-FET 124. Note that a node to which the other of the source and drain terminals of the second n-type Si-FET 112 is connected can be referred to as N4.

The other of the source and drain terminals of the fifth n-type Si-FET 115 is connected to the ground power supply line (GND) 141.

The other of the source and drain terminals of the sixth n-type Si-FET 116 is connected to the ground power supply line (GND) 141.

The gate terminal of the first OS-FET 121 is connected to the low potential power supply line (VDD_L) 142. The other of the source and drain terminals of the first OS-FET 121 is connected to the gate terminal of the third OS-FET 123 and the other terminal of the first capacitor (C1) 131. Note that a node to which the other of the source and drain terminals of the first OS-FET 121 is connected can be referred to as N5.

The gate terminal of the second OS-FET 122 is connected to the low potential power supply line (VDD_L) 142. The other of the source and drain terminals of the second OS-FET 122 is connected to the gate terminal of the fourth OS-FET 124 and the other terminal of the second capacitor (C2) 132. Note that a node to which the other of the source and drain terminals of the second OS-FET 122 is connected can be referred to as N6.

The other of the source and drain terminals of the third OS-FET 123 is connected to the ground power supply line (GND) 141.

The other of the source and drain terminals of the fourth OS-FET 124 is connected to the ground power supply line (GND) 141.

The other terminal of the first resistor 171 is connected to the output signal line (OUT) 161.

The other terminal of the second resistor 172 is connected to the inverted output signal line (OUTB) 162.

The first p-type Si-FET 101 has a function of controlling power supply of the high potential power supply line (VDD_H) 143 in accordance with the potential of the gate terminal of the first p-type Si-FET 101.

The second p-type Si-FET 102 has a function of controlling power supply of the high potential power supply line (VDD_H) 143 in accordance with the potential of the gate terminal of the second p-type Si-FET 102.

The first n-type Si-FET 111 has a function of being off more quickly than the third OS-FET 123 to prevent shoot-through current.

The second n-type Si-FET 112 has a function of being off more quickly than the fourth OS-FET 124 to prevent shoot-through current.

The fifth n-type Si-FET 115 has a function of facilitating the transition operation of the level shifter by applying the potential of the ground power supply line (GND) 141 directly to the gate terminal of the second p-type Si-FET 102.

The sixth n-type Si-FET 116 has a function of facilitating the transition operation of the level shifter by applying the potential of the ground power supply line (GND) 141 directly to the gate terminal of the first p-type Si-FET 101.

The first OS-FET 121 has a function of being off to hold the potential of N5 when the potential of the input signal line (IN) 151 is an H potential and the potential of N5 is raised to a potential higher than the potential of the low potential power supply line (VDD_L) 142 by capacitive coupling.

The second OS-FET 122 has a function of being off to hold the potential of N6 when the potential of the inverted input signal line (INB) 152 is an H potential and the potential of N6 is raised to a potential higher than the potential of the low potential power supply line (VDD_L) 142 by capacitive coupling.

The third OS-FET 123 has a function of reducing off-leakage current.

The fourth OS-FET 124 has a function of reducing off-leakage current.

The first capacitor (C1) 131 between N5 and the output signal line (OUT) 161 has a function of supplying a high potential due to capacitive coupling to N5 to increase the on-state current of the third OS-FET 123. Note that parasitic capacitance or the like between wirings can be used instead of the first capacitor (C1) 131 as long as the potential rise due to capacitive coupling is sufficient.

The second capacitor (C2) 132 between N6 and the inverted output signal line (OUTB) 162 has a function of supplying a high potential due to capacitive coupling to N6 to increase the on-state current of the fourth OS-FET 124. Note that parasitic capacitance or the like between wirings can be used instead of the second capacitor (C2) 132 as long as the potential rise due to capacitive coupling is sufficient.

The first resistor 171 has a function as a resistor that limits supply of the potential of the high potential power supply line (VDD_H) 143 through the first p-type Si-FET 101, which facilitates supply of the potential of the ground power supply line (GND) 141 through the sixth n-type Si-FET 116 and the transition operation of the level shifter.

The second resistor 172 has a function as a resistor that limits supply of the potential of the high potential power supply line (VDD_H) 143 through the second p-type Si-FET 102, which facilitates supply of the potential of the ground power supply line (GND) 141 through the fifth n-type Si-FET 115 and the transition operation of the level shifter.

Note that this embodiment can be implemented in appropriate combination with other embodiments.

(Embodiment 5)

Another configuration of the level shifter of one embodiment of the present invention will be described with reference to FIG. 5.

Figure 5:
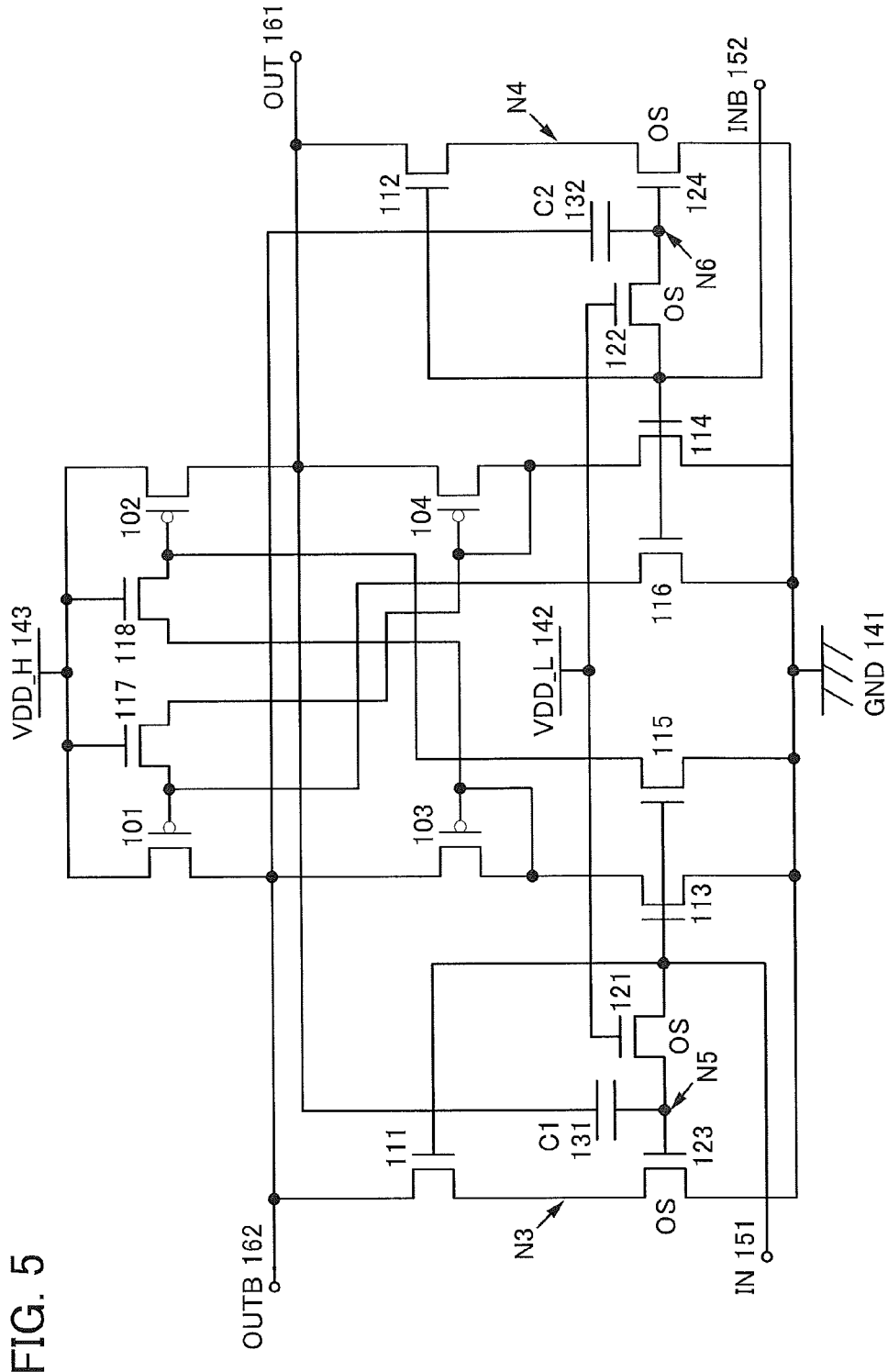
FIG. 5 is a circuit diagram of a level shifter of one embodiment of the present invention.

FIG. 5 is a circuit diagram of the level shifter. The level shifter of one embodiment of the present invention includes the first p-type Si-FET 101, the second p-type Si-FET 102, the third p-type Si-FET 103, the fourth p-type Si-FET 104, the first n-type Si-FET 111, the second n-type Si-FET 112, the third n-type Si-FET 113, the fourth n-type Si-FET 114, the fifth n-type Si-FET 115, the sixth n-type Si-FET 116, the seventh n-type Si-FET 117, the eighth n-type Si-FET 118, the first OS-FET 121, the second OS-FET 122, the third OS-FET 123, the fourth OS-FET 124, the first capacitor (C1) 131, the second capacitor (C2) 132, the ground power supply line (GND) 141, the low potential power supply line (VDD_L) 142, the high potential power supply line (VDD_H) 143, the input signal line (IN) 151, the inverted input signal line (INB) 152, the output signal line (OUT) 161, and the inverted output signal line (OUTB) 162.

The gate terminal of the first p-type Si-FET 101 is connected to one of the source and drain terminals of the sixth n-type Si-FET 116 and one of the source and drain terminals of the seventh n-type Si-FET 117. One of the source and drain terminals of the first p-type Si-FET 101 is connected to the high potential power supply line (VDD_H) 143. The other of the source and drain terminals of the first p-type Si-FET 101 is connected to one of the source and drain terminals of the third p-type Si-FET 103, one of the source and drain terminals of the first n-type Si-FET 111, one terminal of the second capacitor (C2) 132, and the inverted output signal line (OUTB) 162.

The gate terminal of the second p-type Si-FET 102 is connected to one of the source and drain terminals of the fifth n-type Si-FET 115 and one of the source and drain terminals of the eighth n-type Si-FET 118. One of the source and drain terminals of the second p-type Si-FET 102 is connected to the high potential power supply line (VDD_H) 143. The other of the source and drain terminals of the second p-type Si-FET 102 is connected to one of the source and drain terminals of the fourth p-type Si-FET 104, one of the source and drain terminals of the second n-type Si-FET 112, one terminal of the first capacitor (C1) 131, and the output signal line (OUT) 161.

The gate terminal of the third p-type Si-FET 103 is connected to the other of the source and drain terminals of the third p-type Si-FET 103, one of the source and drain terminals of the third n-type Si-FET 113, and the other of the source and drain terminals of the eighth n-type Si-FET 118.

The gate terminal of the fourth p-type Si-FET 104 is connected to the other of the source and drain terminals of the fourth p-type Si-FET 104, one of the source and drain terminals of the fourth n-type Si-FET 114, and the other of the source and drain terminals of the seventh n-type Si-FET 117.

The gate terminal of the first n-type Si-FET 111 is connected to the input signal line (IN) 151, the gate terminal of the third n-type Si-FET 113, the gate terminal of the fifth n-type Si-FET 115, and one of the source and drain terminals of the first OS-FET 121. The other of the source and drain terminals of the first n-type Si-FET 111 is connected to one of the source and drain terminals of the third OS-FET 123. Note that a node to which the other of the source and drain terminals of the first n-type Si-FET 111 is connected can be referred to as N3.

The gate terminal of the second n-type Si-FET 112 is connected to the inverted input signal line (INB) 152, the gate terminal of the fourth n-type Si-FET 114, the gate terminal of the sixth n-type Si-FET 116, and one of the source and drain terminals of the second OS-FET 122. The other of the source and drain terminals of the second n-type Si-FET 112 is connected to one of the source and drain terminals of the fourth OS-FET 124. Note that a node to which the other of the source and drain terminals of the second n-type Si-FET 112 is connected can be referred to as N4.

The other of the source and drain terminals of the third n-type Si-FET 113 is connected to the ground power supply line (GND) 141.

The other of the source and drain tetininals of the fourth n-type Si-FET 114 is connected to the ground power supply line (GND) 141.

The other of the source and drain terminals of the fifth n-type Si-FET 115 is connected to the ground power supply line (GND) 141.

The other of the source and drain terminals of the sixth n-type Si-FET 116 is connected to the ground power supply line (GND) 141.

The gate terminal of the seventh n-type Si-FET 117 is connected to the high potential power supply line (VDD_H) 143.

The gate terminal of the eighth n-type Si-FET 118 is connected to the high potential power supply line (VDD_H) 143.

The gate terminal of the first OS-FET 121 is connected to the low potential power supply line (VDD_L) 142. The other of the source and drain terminals of the first OS-FET 121 is connected to the gate terminal of the third OS-FET 123 and the other terminal of the first capacitor (C1) 131. Note that a node to which the other of the source and drain terminals of the first OS-FET 121 is connected can be referred to as N5.

The gate terminal of the second OS-FET 122 is connected to the low potential power supply line (VDD_L) 142. The other of the source and drain terminals of the second OS-FET 122 is connected to the gate terminal of the fourth OS-FET 124 and the other terminal of the second capacitor (C2) 132. Note that a node to which the other of the source and drain terminals of the second OS-FET 122 is connected can be referred to as N6.

The other of the source and drain terminals of the third OS-FET 123 is connected to the ground power supply line (GND) 141.

The other of the source and drain terminals of the fourth OS-FET 124 is connected to the ground power supply line (GND) 141.

The first p-type Si-FET 101 has a function of controlling power supply of the high potential power supply line (VDD_H) 143 in accordance with the potential of the gate terminal of the first p-type Si-FET 101.

The second p-type Si-FET 102 has a function of controlling power supply of the high potential power supply line (VDD_H) 143 in accordance with the potential of the gate terminal of the second p-type Si-FET 102.

The third p-type Si-FET 103, which is a diode-connected transistor, has a function of limiting supply of the potential of the high potential power supply line (VDD_H) 143 through the first p-type Si-FET 101 so as not to raise the potential of the gate terminal to the potential of the high potential power supply line (VDD_H) 143, leading to easy supply of the potential of the ground power supply line (GND) 141 through the third n-type Si-FET 113.

The fourth p-type Si-FET 104, which is a diode-connected transistor, has a function of limiting supply of the potential of the high potential power supply line (VDD_H) 143 through the second p-type Si-FET 102 so as not to raise the potential of the gate terminal to the potential of the high potential power supply line (VDD_H) 143, leading to easy supply of the potential of the ground power supply line (GND) 141 through the fourth n-type Si-FET 114.

The first n-type Si-FET 111 has a function of being off more quickly than the third OS-FET 123 to reduce shoot-through current.

The second n-type Si-FET 112 has a function of being off more quickly than the fourth OS-FET 124 to reduce shoot-through current.

The third n-type Si-FET 113 has a function of controlling power supply of the ground power supply line (GND) 141 to the gate terminal of the third p-type Si-FET 103.

The fourth n-type Si-FET 114 has a function of controlling power supply of the ground power supply line (GND) 141 to the gate terminal of the fourth p-type Si-FET 104.

The fifth n-type Si-FET 115 has a function of facilitating the transition operation of the level shifter by applying the potential of the ground power supply line (GND) 141 directly to the gate terminal of the second p-type Si-FET 102.

The sixth n-type Si-FET 116 has a function of facilitating the transition operation of the level shifter by applying the potential of the ground power supply line (GND) 141 directly to the gate terminal of the first p-type Si-FET 101.

The seventh n-type Si-FET 117 serves as a variable resistor whose resistance changes in accordance with the potential of the source or the drain and has a function of facilitating the transition operation of the level shifter.

The eighth n-type Si-FET 118 serves as a variable resistor whose resistance changes in accordance with the potential of the source or the drain and has a function of facilitating the transition operation of the level shifter.

The first OS-FET 121 has a function of being off to hold the potential of N5 when the potential of the input signal line (IN) 151 is an II potential and the potential of N5 is raised to a potential higher than the potential of the low potential power supply line (VDD_L) 142 by capacitive coupling.

The second OS-FET 122 has a function of being off to hold the potential of N6 when the potential of the inverted input signal line (INB) 152 is an H potential and the potential of N6 is raised to a potential higher than the potential of the low potential power supply line (VDD_L) 142 by capacitive coupling.

The third OS-FET 123 has a function of reducing off-leakage current.

The fourth OS-FET 124 has a function of reducing off-leakage current.

The first capacitor (C1) 131 between N5 and the output signal line (OUT) 161 has a function of supplying a high potential due to capacitive coupling to N5 to increase the on-state current of the third OS-FET 123. Note that parasitic capacitance or the like between wirings can be used instead of the first capacitor (C1) 131 as long as the potential rise due to capacitive coupling is sufficient.

The second capacitor (C2) 132 between N6 and the inverted output signal line (OUTB) 162 has a function of supplying a high potential due to capacitive coupling to N6 to increase the on-state current of the fourth OS-FET 124. Note that parasitic capacitance or the like between wirings can be used instead of the second capacitor (C2) 132 as long as the potential rise due to capacitive coupling is sufficient.

Note that this embodiment can be implemented in appropriate combination with other embodiments.

(Embodiment 6)

In this embodiment, a structure example of a transistor that can be used in the level shifter circuit of one embodiment of the present invention will be described.

<Structure of Transistors>

Figure 6:
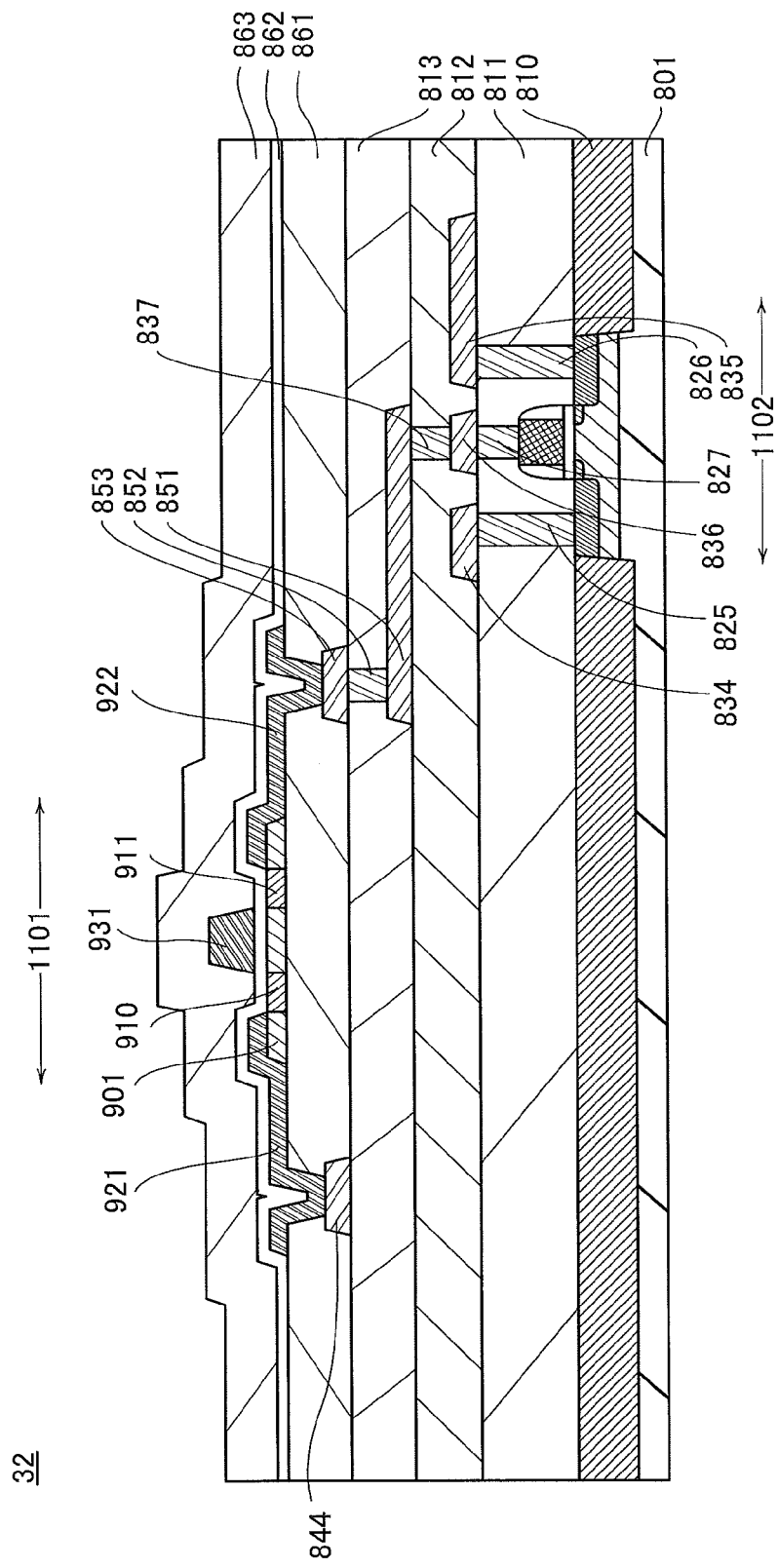
FIG. 6 illustrates a structural example of transistors of one embodiment of the present invention.

FIG. 6 illustrates a cross-sectional structure of transistors. In FIG. 6, a transistor 1101 whose channel formation region is in an oxide semiconductor film (hereinafter, also referred to as an OS transistor) is formed over a transistor 1102 whose channel formation region is in a single crystal silicon substrate (hereinafter, also referred to as a Si transistor). The transistor 1101 can be used as the OS-FET 121 and the transistor 1102 can be used as the n-type Si-FET 113, for example.

The transistor 1102 may include the channel formation region in a semiconductor film or a semiconductor substrate of silicon, germanium, or the like in an amorphous, microcrystalline, polycrystalline, or single crystal state. Alternatively, the transistor 1102 may include the channel formation region in an oxide semiconductor film or an oxide semiconductor substrate. In the case where the transistors each include a channel formation region in an oxide semiconductor film or an oxide semiconductor substrate, the transistor 1101 is not necessarily stacked over the transistor 1102, and the transistors 1101 and 1102 may be formed in the same layer.

In the case where the transistor 1102 is formed using a thin silicon film, any of the following can be used in the thin film: amorphous silicon formed by a sputtering method or a vapor phase growth method such as a plasma CVD method; polycrystalline silicon obtained by crystallization of amorphous silicon by treatment such as laser irradiation; single crystal silicon obtained by separation of a surface portion of a single crystal silicon wafer by implantation of hydrogen ions or the like into the silicon wafer; and the like.

A semiconductor substrate 801 where the transistor 1102 is formed can be, for example, a silicon substrate, a germanium substrate, or a silicon germanium substrate. In FIG. 6, a single crystal silicon substrate is used as the semiconductor substrate 801.

The transistor 1102 is electrically isolated by an element isolation method. As the element isolation method, a selective oxidation method (a local oxidation of silicon (LOCOS) method), a trench isolation method (a shallow trench isolation (STI) method), or the like can be used. FIG. 6 illustrates an example where the trench isolation method is used to electrically isolate the transistor 1102. Specifically, in FIG. 6, the transistor 1102 is electrically isolated by element isolation using an element isolation region 810 formed in such a manner that an insulator including silicon oxide or the like is buried in a trench formed in the semiconductor substrate 801 by etching or the like.

An insulating film 811 is provided over the transistor 1102. Opening portions are formed in the insulating film 811. Conductive films 825 and 826 that are electrically connected to the source and the drain of the transistor 1102 and a conductive film 827 that is electrically connected to the gate of the transistor 1102 are formed in the opening portions.

The conductive film 825 is electrically connected to a conductive film 834 formed over the insulating film 811. The conductive film 826 is electrically connected to a conductive film 835 formed over the insulating film 811. The conductive film 827 is electrically connected to a conductive film 836 formed over the insulating film 811.

An insulating film 812 is formed over the conductive films 834 to 836. An opening portion is formed in the insulating film 812. A conductive film 837 electrically connected to the conductive film 836 is formed in the opening portion. The conductive film 837 is electrically connected to a conductive film 851 formed over the insulating film 812.

An insulating film 813 is formed over the conductive film 851. An opening portion is formed in the insulating film 813. A conductive film 852 electrically connected to the conductive film 851 is formed in the opening portion. The conductive film 852 is electrically connected to a conductive film 853 formed over the insulating film 813. A conductive film 844 is formed over the insulating film 813.

An insulating film 861 is foi wed over the conductive film 853 and the conductive film 844. In FIG. 6, the transistor 1101 is formed over the insulating film 861.

The transistor 1101 includes a semiconductor film 901 containing an oxide semiconductor over the insulating film 861; a conductive film 921 and a conductive film 922 serving as a source and a drain, which are over the semiconductor film 901; a gate insulating film 862 over the semiconductor film 901, the conductive film 921, and the conductive film 922; and a gate electrode 931 which is over the gate insulating film 862 and overlaps with the semiconductor film 901 in a region between the conductive film 921 and the conductive film 922. Note that the conductive film 922 is electrically connected to the conductive film 853 in an opening portion provided in the insulating film 861.

In the semiconductor film 901 of the transistor 1101, there is a region 910 between a region overlapping with the conductive film 921 and a region overlapping with the gate electrode 931. In addition, in the semiconductor film 901 of the transistor 1101, there is a region 911 between a region overlapping with the conductive film 922 and the region overlapping with the gate electrode 931. When argon, an impurity which imparts p-type conductivity to the semiconductor film 901, or an impurity which imparts n-type conductivity to the semiconductor film 901 is added to the regions 910 and 911 using the conductive films 921 and 922 and the gate electrode 931 as a mask, the resistivity of the regions 910 and 911 can be made lower than that of the region overlapping with the gate electrode 931 in the semiconductor film 901.

An insulating film 863 is provided over the transistor 1101.

In FIG. 6, the transistor 1101 has the gate electrode 931 on at least one side of the semiconductor film 901; alternatively, the transistor 1101 may have a pair of gate electrodes with the semiconductor film 901 positioned therebetween.

In the case where the transistor 1101 has a pair of gate electrodes with the semiconductor film 901 positioned therebetween, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 6, the transistor 1101 has a single-gate structure where one channel formation region corresponding to one gate electrode 931 is provided. However, the transistor 1101 may have a multi-gate structure where a plurality of electrically connected gate electrodes are provided so that a plurality of channel formation regions are included in one active layer.

<Another Structure Example of Transistor>

Next, an example of a structure of a transistor 90 that includes a channel formation region in an oxide semiconductor film will be described with reference to FIGS. 7A to 7C.

Figure 7A:
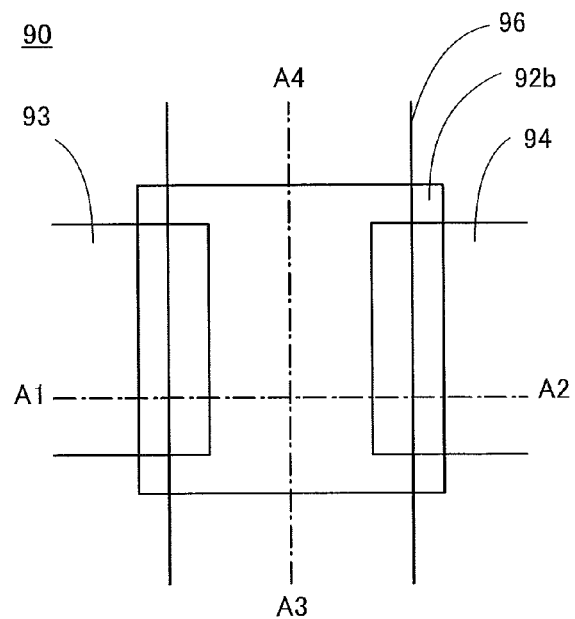
FIGS. 7A to 7C illustrate a structural example of a transistor of one embodiment of the present invention.
Figure 7C:
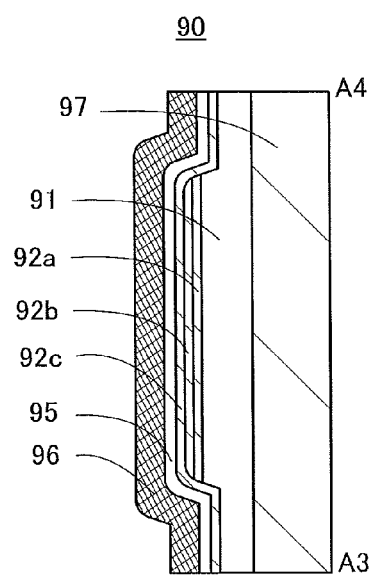
Figure 7B:
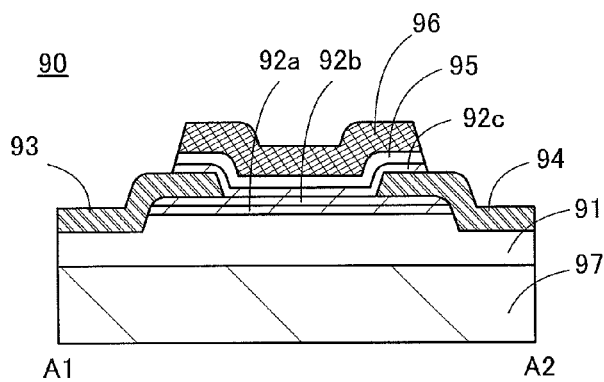

FIGS. 7A to 7C illustrate a structure of the transistor 90 that includes a channel formation region in an oxide semiconductor film as an example. FIG. 7A is a top view of the transistor 90. Note that insulating films are not illustrated in FIG. 7A to clarify the layout of the transistor 90. FIG. 7B is a cross-sectional view along dashed-dotted line A1-A2 in the top view in FIG. 7A. FIG. 7C is a cross-sectional view along dashed-dotted line A3-A4 in the top view in FIG. 7A.

As illustrated in FIGS. 7A to 7C, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that functions as a gate insulating film and is located over the oxide semiconductor film 92c; and a conductive film 96 that functions as a gate electrode, lies over the insulating film 95, and overlaps with the oxide semiconductor films 92a to 92c. Note that the substrate 97 may be a glass substrate, a semiconductor substrate, or the like or may be an element substrate where semiconductor elements are formed over a glass substrate or on a semiconductor substrate.

Figure 8A:
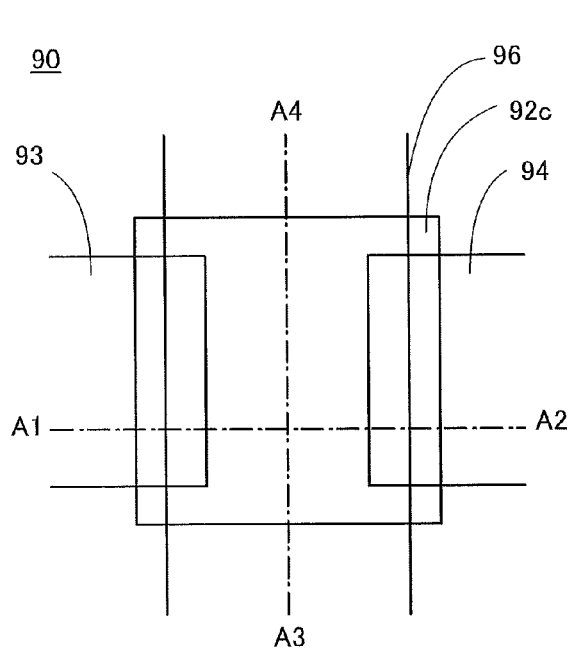
FIGS. 8A to 8C illustrate a structural example of a transistor of one embodiment of the present invention.
Figure 8C:
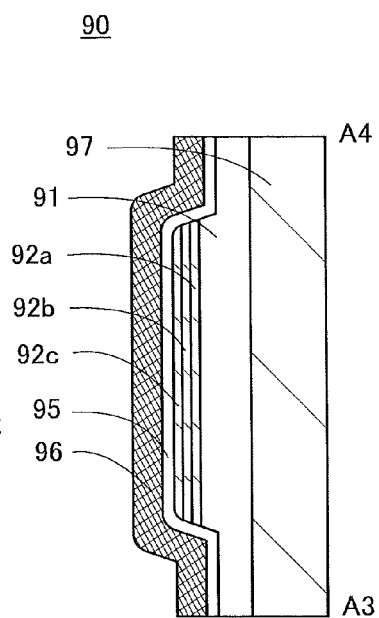
Figure 8B:
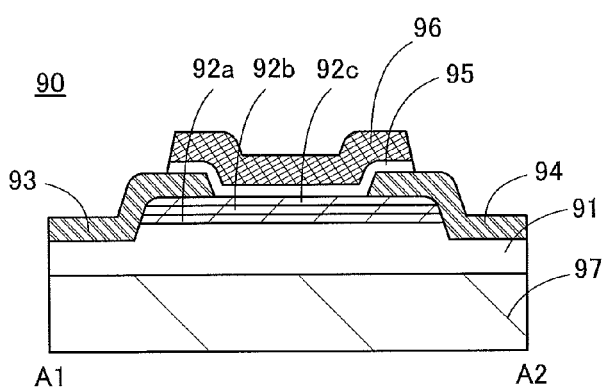

FIGS. 8A to 8C illustrate another specific example of the structure of the transistor 90. FIG. 8A is a top view of the transistor 90. Note that insulating films are not illustrated in FIG. 8A to clarify the layout of the transistor 90. FIG. 8B is a cross-sectional view along dashed-dotted line A1-A2 in the top view in FIG. 8A. FIG. 8C is a cross-sectional view along dashed-dotted line A3-A4 in the top view in FIG. 8A.

As illustrated in FIGS. 8A to 8C, the transistor 90 includes the oxide semiconductor films 92a to 92c that are stacked in this order over the insulating film 91; the conductive films 93 and 94 that are electrically connected to the oxide semiconductor film 92c and function as a source electrode and a drain electrode; the insulating film 95 that functions as a gate insulating film and is located over the oxide semiconductor film 92c and the conductive films 93 and 94; and the conductive film 96 that functions as a gate electrode, lies over the insulating film 95, and overlaps with the oxide semiconductor films 92a to 92c.

FIGS. 7A to 7C and FIGS. 8A to 8C each illustrate the structural example of the transistor 90 in which the oxide semiconductor films 92a to 92c are stacked. However, the structure of the oxide semiconductor film included in the transistor 90 is not limited to a stacked-layer structure including a plurality of oxide semiconductor films and may be a single-layer structure.

In the case where the transistor 90 includes the semiconductor film in which the semiconductor films 92a to 92c are stacked in this order, each of the oxide semiconductor films 92a and 92c is an oxide film that contains at least one of metal elements contained in the oxide semiconductor film 92b and in which energy at the conduction band minimum is closer to the vacuum level than that in the oxide semiconductor film 92b is by higher than or equal to 0.05 eV, 0.07 eV, 0.1 eV, or 0.15 eV and lower than or equal to 2 eV, 1 eV, 0.5 eV, or 0.4 eV. The oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b, which has the lowest conduction band minimum among the semiconductor films That is, since the oxide semiconductor film 92c is provided between the oxide semiconductor film 92b and the insulating film 95, a channel region can be formed in the oxide semiconductor film 92b, which is separated from the insulating film 95.

Since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

When an interface state is formed at an interface between the oxide semiconductor films 92b and 92a, a channel region is also formed in a region close to the interface; thus, the threshold voltage of the transistor 90 varies. However, since the oxide semiconductor film 92a contains at least one of metal elements contained in the oxide semiconductor film 92b, an interface state is unlikely to be formed at the interface between the oxide semiconductor film 92b and the oxide semiconductor film 92a. Accordingly, the above structure can reduce variations in electrical characteristics of the transistor 90, such as the threshold voltage.

Further, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of −40° C. or lower, preferably −80° C. or lower, further preferably −100° C. or lower and is highly purified, moisture and the like can be prevented from entering the oxide semiconductor film as much as possible. Specifically, in the case where the oxide semiconductor film 92b is an In-M-Zn oxide film (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1$/$y_1$ is preferably greater than or equal to ⅓ and less than or equal to 6, further preferably greater than or equal to 1 and less than or equal to 6, and $z_1$/$y_1$ is preferably greater than or equal to ⅓ and less than or equal to 6, further preferably greater than or equal to 1 and less than or equal to 6. Note that when $z_1$/$y_1$ is greater than or equal to 1 and less than or equal to 6, a c-axis aligned crystalline oxide semiconductor (CAAC-OS) film as the oxide semiconductor film 92b is easily formed. Typical examples of the atomic ratio of the metal elements of the target are In:M:Zn=1:1:1 and In:M:Zn=3:1:2.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 92a and 92c, $x_2$/$y_2$ is preferably less than $x_1$/$y_1$, and $z_2$/$y_2$ is preferably greater than or equal to ⅓ and less than or equal to 6, further preferably greater than or equal to 1 and less than or equal to 6. Note that when $z_2$/$y_2$ is greater than or equal to 1 and less than or equal to 6, CAAC-OS films are easily formed as the oxide semiconductor films 92a and 92c. Typical examples of the atomic ratio of the metal elements of the target are In:M:Zn=1:3:2, In:M:Zn=1:3:4, In:M:Zn=1:3:6, In:M:Zn=1:3:8, and the like.

The oxide semiconductor film 92a and the oxide semiconductor film 92c each have a thickness of more than or equal to 3 nm and less than or equal to 100 nm, preferably more than or equal to 3 nm and less than or equal to 50 nm The thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the three oxide semiconductor films 92a to 92c can be either amorphous or crystalline. Note that the oxide semiconductor film 92b in which a channel region is formed preferably has a crystalline structure, in which case the transistor 90 can have stable electrical characteristics.

Note that a channel formation region refers to a region of a semiconductor film of the transistor 90 that overlaps with a gate electrode and is between a source electrode and a drain electrode. A channel region refers to a region through which current mainly flows in the channel formation region.

For example, when an In—Ga—Zn oxide film formed by a sputtering method is used as each of the oxide semiconductor films 92a and 92c, the oxide semiconductor films 92a and 92c can be deposited with the use of an In—Ga—Zn oxide target containing In, Ga, and Zn in an atomic ratio of 1:3:2. The deposition conditions can be as follows: an argon gas (flow rate: 30 sccm) and an oxygen gas (flow rate: 15 sccm) are used as the deposition gas; the pressure is 0.4 Pa; the substrate temperature is 200° C.; and the DC power is 0.5 kW.

Furthermore, when the oxide semiconductor film 92b is a CAAC-OS film, the oxide semiconductor film 92b is preferably deposited with the use of a polycrystalline target containing an In—Ga—Zn oxide (In:Ga:Zn=1:1:1 [atomic ratio]). The deposition conditions can be as follows: an argon gas (flow rate: 30 sccm) and an oxygen gas (flow rate: 15 sccm) are used as the deposition gas; the pressure is 0.4 Pa; the substrate temperature is 300 ° C.; and the DC power is 0.5 kW. When the oxide semiconductor film 92b is a CAAC-OS film, the oxide semiconductor film 92b may be deposited with the use of an In—Ga—Zn oxide (In:Ga:Zn=2:1:3 [atomic ratio]) as a target. A CAAC-OS film deposited with the use of such a target can have a high proportion of regions where a diffraction pattern of CAAC-OS is observed in a predetermined area (also referred to as proportion of CAAC); thus, a transistor having a channel formation region in this CAAC-OS film can have excellent frequency characteristics.

Note that the oxide semiconductor films 92a to 92c can be formed by a sputtering method.

There are few carrier generation sources in a highly purified oxide semiconductor obtained by reduction of impurities such as moisture and hydrogen serving as electron donors (donors) and reduction of oxygen vacancies; therefore, the highly purified oxide semiconductor can be an intrinsic (i-type) semiconductor or a substantially i-type semiconductor. For this reason, a transistor having a channel formation region in a highly purified oxide semiconductor film has extremely small off-state current and high reliability. Thus, a transistor in which a channel formation region is formed in the oxide semiconductor film easily has an electrical characteristic of a positive threshold voltage (also referred to as a normally-off characteristic).

Specifically, various experiments can prove a small off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at voltage (drain voltage) between the source electrode and the drain electrode of from 1 V to 10 V. In that case, it can be seen that off-state current of the transistor normalized on the channel width is lower than or equal to 100 zA/μm. In addition, a capacitor and a transistor were connected to each other and off-state current was measured using a circuit in which charges flowing to or from the capacitor are controlled by the transistor. In the measurement, a highly purified oxide semiconductor film was used for a channel formation region of the transistor, and the off-state current of the transistor was measured from a change in the amount of charges of the capacitor per unit time. As a result, it can be seen that, in the case where the voltage between the source electrode and the drain electrode of the transistor is 3 V, a lower off-state current of several tens of yoctoamperes per micrometer (yA/μm) is obtained. Accordingly, the transistor including a channel formation region in the highly purified oxide semiconductor film has much lower off-state current than a crystalline silicon transistor.

In the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be formed by a sputtering method or a wet process. Further, unlike silicon carbide, gallium nitride, or gallium oxide, with the use of the In—Ga—Zn oxide, a transistor with favorable electrical characteristics can be fanned over a glass substrate. Further, a larger substrate can be used.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, any of the following oxides can be used, for example: indium oxide, gallium oxide, tin oxide, zinc oxide, an In—Zn oxide, an Sn—Zn oxide, an Al—Zn oxide, a Zn—Mg oxide, an Sn—Mg oxide, an In—Mg oxide, an In—Ga oxide, an In—Ga—Zn oxide (also referred to as IGZO), an In—Al—Zn oxide, an In—Sn—Zn oxide, an Sn—Ga—Zn oxide, an Al—Ga—Zn oxide, an Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide refers to an oxide containing In, Ga, and Zn, and there is no limitation on the ratio of In to Ga and Zn. Further, the In—Ga—Zn oxide may contain a metal element other than In, Ga, and Zn. The In—Ga—Zn oxide has sufficiently high resistance when no electric field is applied thereto, so that off-state current can be sufficiently reduced. Moreover, the In—Ga—Zn oxide has high mobility.

For example, high mobility can be obtained relatively easily in the case of using an In—Sn—Zn oxide. Meanwhile, when an In—Ga—Zn oxide is used, the mobility can be increased by reducing the defect density in a bulk.

In the transistor 90, a metal in the source and drain electrodes might extract oxygen from the oxide semiconductor film depending on a conductive material used for the source and drain electrodes. In such a case, a region of the oxide semiconductor film in contact with the source electrode or the drain electrode becomes an n-type region due to the formation of an oxygen vacancy. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. The n-type region is more likely to be formed by forming the source electrode and the drain electrode with use of a conductive material that is easily bonded to oxygen. Examples of such a conductive material include Al, Cr, Cu, Ta, Ti, Mo, and W.

Furtheimore, in the case where the semiconductor film including the stacked oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 preferably has a function of supplying part of oxygen to the oxide semiconductor films 92a to 92c by heating. It is preferable that the number of defects in the insulating film 91 be small, and typical spin density at g=2.001 due to a dangling bond of silicon be lower than or equal to $1\times10^{18}$ spins/cm$^3$. The spin density is measured by electron spin resonance (ESR) spectroscopy.

The insulating film 91, which has a function of supplying part of oxygen to the oxide semiconductor films 92a to 92c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 91 can be formed by a plasma chemical vapor deposition (CVD) method, a sputtering method, or the like.

Note that in this specification, oxynitride contains more oxygen than nitrogen, and nitride oxide contains more nitrogen than oxygen.

Note that in the transistor 90 illustrated in FIGS. 7A to 7C or FIGS. 8A to 8C, the conductive film 96 overlaps with end portions of the oxide semiconductor film 92b including a channel region that do not overlap with the conductive films 93 and 94, i.e., end portions of the oxide semiconductor film 92b that are in a region different from a region where the conductive films 93 and 94 are located. When the end portions of the oxide semiconductor film 92b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity.

However, an electric field applied to the end portions can be controlled by controlling the potential of the conductive film 96 because the end portions of the oxide semiconductor film 92b that do not overlap with the conductive films 93 and 94 overlap with the conductive film 96 in the transistor 90 illustrated in FIGS. 7A to 7C or FIGS. 8A to 8C. Consequently, current that flows between the conductive films 93 and 94 through the end portions of the oxide semiconductor film 92b can be controlled by the potential applied to the conductive film 96. Such a structure of the transistor 90 is referred to as a surrounded channel (s-channel) structure.

With the s-channel structure, specifically, when a potential at which the transistor 90 is turned off is supplied to the conductive film 96, the amount of off-state current that flows between the conductive films 93 and 94 through the end portions can be reduced. For this reason, in the transistor 90, even when the distance between the conductive films 93 and 94 at the end portions of the oxide semiconductor film 92b is reduced as a result of reducing the channel length to obtain high on-state current, the transistor 90 can have low off-state current. Consequently, with the short channel length, the transistor 90 can have high on-state current when in an on state and low off-state current when in an off state.

With the s-channel structure, specifically, when a potential at which the transistor 90 is turned on is supplied to the conductive film 96, the amount of current that flows between the conductive films 93 and 94 through the end portions of the oxide semiconductor film 92b can be increased. The current contributes to an increase in the field-effect mobility and an increase in the on-state current of the transistor 90. When the end portions of the oxide semiconductor film 92b overlap with the conductive film 96, carriers flow in a wide region of the oxide semiconductor film 92b without being limited to a region in the vicinity of the interface between the oxide semiconductor film 92b and the insulating film 95, which results in an increase in the amount of carrier movement in the transistor 90. As a result, the on-state current of the transistor 90 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is the apparent field-effect mobility in a saturation region of the transistor, which is an index of current drive capability.

Note that this embodiment can be implemented in appropriate combination with other embodiments.

(Embodiment 7)

In this embodiment, an example of a semiconductor device having a structure different from that in FIG. 6 will be described.

Figure 9:
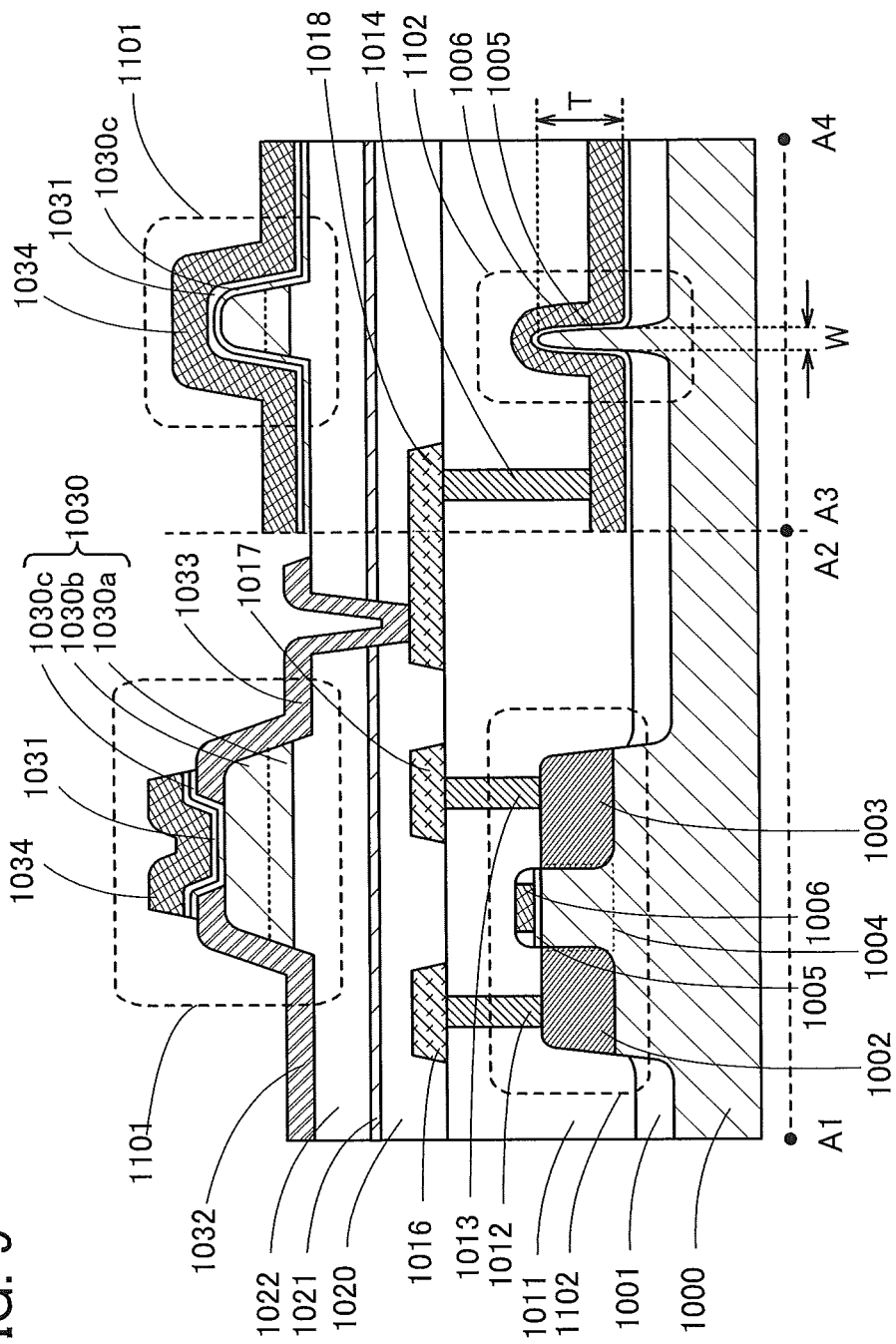
FIG. 9 illustrates a structural example of transistors of one embodiment of the present invention.

FIG. 9 illustrates an example of a cross-sectional structure of a semiconductor device including FETs corresponding to the OS-FET 121 and the n-type Si-FET 113 in FIG. 1. A region along dashed line A1-A2 shows a structure of the transistors 1102 and 1101 in the channel length direction, and a region along dashed line A3-A4 shows a structure of the transistors 1102 and 1101 in the channel width direction. Note that in one embodiment of the present invention, the channel length direction of the transistor 1102 is not necessarily the same as that of the transistor 1101.

The channel length direction refers to a direction in which a carrier moves between a source (a source region or a source electrode) and a drain (a drain region or a drain electrode), and the channel width direction refers to a direction perpendicular to the channel length direction in a plane parallel to a substrate.

In the example illustrated in FIG. 9, the transistor 1101 including a channel formation region in an oxide semiconductor film is formed over the transistor 1102 including a channel formation region in a single crystal silicon substrate. Note that such a structure in which a Si transistor and an OS transistor are stacked can be appropriately used for the OS-FET 121 and the n-type Si-FET 113, and the OS-FET 122 and the n-type Si-FET 114 in FIG. 1. For example, the p-type Si-FETs 101, 102, 103, and 104 and the n-type Si-FETs 111, 112, 113, and 114 in FIG. 1 can be formed by using a single crystal silicon substrate like the transistor 1102 in FIG. 9, and the OS-FETs 121, 122, 123, and 124 in FIG. 1 can be formed over the transistor formed the single crystal silicon substrate, like the transistor 1101 in FIG. 9.

The transistor 1102 may include the channel formation region in a semiconductor film or a semiconductor substrate of silicon, germanium, or the like in an amorphous, microcrystalline, polycrystalline, or single crystal state. Alternatively, the transistor 1102 may include the channel formation region in an oxide semiconductor film or an oxide semiconductor substrate. In the case where the transistors each include a channel formation region in an oxide semiconductor film or an oxide semiconductor substrate, the transistor 1101 is not necessarily stacked over the transistor 1102, and the transistors 1101 and 1102 may be formed in the same layer.

In the case where the transistor 1102 is formed using a thin silicon film, any of the following can be used in the thin film: amorphous silicon formed by a sputtering method or a vapor phase growth method such as a plasma CVD method; polycrystalline silicon obtained by crystallization of amorphous silicon by treatment such as laser irradiation; single crystal silicon obtained by separation of a surface portion of a single crystal silicon wafer by implantation of hydrogen ions or the like into the silicon wafer; and the like.

A substrate 1000 where the transistor 1102 is formed can be, for example, a silicon substrate, a germanium substrate, or a silicon germanium substrate. In FIG. 9, a single crystal silicon substrate is used as the substrate 1000.

The transistor 1102 is electrically isolated by an element isolation method. As the element isolation method, a trench isolation method (a shallow trench isolation (STI) method)

or the like can be used. FIG. 9 illustrates an example where the trench isolation method is used to electrically isolate the transistor 1102. Specifically, in FIG. 9, the transistor 1102 is electrically isolated by element isolation using an element isolation region 1001 formed in such a manner that an insulator including silicon oxide or the like is buried in a trench formed in the substrate 1000 by etching or the like and then the insulator is removed partly by etching or the like.

In a projection of the substrate 1000 that exists in a region other than the trench, an impurity region 1002 and an impurity region 1003 of the transistor 1102 and a channel formation region 1004 placed between the impurity regions 1002 and 1003 are provided. Furthermore, the transistor 1102 includes an insulating film 1005 covering the channel formation region 1004 and a gate electrode 1006 that overlaps with the channel foimation region 1004 with the insulating film 1005 provided therebetween.

In the transistor 1102, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, an area over the substrate occupied by the transistor 1102 can be reduced, and the number of transferred carriers in the transistor 1102 can be increased. As a result, the on-state current and field-effect mobility of the transistor 1102 are increased. Suppose the length in the channel width direction (channel width) of the projection in the channel formation region 1004 is W, and the thickness of the projection in the channel formation region 1004 is T. When the aspect ratio of the thickness T to the channel width W is high, a region where carriers flow becomes larger. Thus, the on-state current of the transistor 1102 can be further increased and the field-effect mobility of the transistor 1102 can be further increased.

Note that when the transistor 1102 is formed using a bulk semiconductor substrate, the aspect ratio is preferably 0.5 or more, further preferably 1 or more.

An insulating film 1011 is provided over the transistor 1102. Opening portions are formed in the insulating film 1011. Conductive films 1012 and 1013 that are electrically connected to the impurity regions 1002 and 1003, respectively, and a conductive film 1014 that is electrically connected to the gate electrode 1006 are formed in the opening portions.

The conductive film 1012 is electrically connected to a conductive film 1016 formed over the insulating film 1011. The conductive film 1013 is electrically connected to a conductive film 1017 formed over the insulating film 1011. The conductive film 1014 is electrically connected to a conductive film 1018 formed over the insulating film 1011.

An insulating film 1020 is provided over the conductive films 1016 to 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the insulating film 1021 has a higher blocking effect. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride or silicon nitride oxide.

An insulating film 1022 is provided over the insulating film 1021, and the transistor 1101 is provided over the insulating film 1022.

The transistor 1101 includes, over the insulating film 1022, a semiconductor film 1030 including an oxide semiconductor, conductive films 1032 and 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening portion is formed in the insulating films 1020 to 1022. The conductive film 1033 is connected to the conductive film 1018 in the opening portion.

Note that in FIG. 9, the transistor 1101 includes at least the gate electrode 1034 on one side of the semiconductor film 1030, and may further include a gate electrode overlapping with the semiconductor film 1030 with the insulating film 1022 positioned therebetween.

In the case where the transistor 1101 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 9, the transistor 1101 has a single-gate structure where one channel formation region corresponding to one gate electrode 1034 is provided. However, the transistor 1101 may have a multi-gate structure where a plurality of electrically connected gate electrodes are provided so that a plurality of channel formation regions are included in one active layer.

FIG. 9 illustrates an example in which the semiconductor film 1030 included in the transistor 1101 includes oxide semiconductor films 1030a to 1030c that are stacked in this order over the insulating film 1022. Note that in one embodiment of the present invention, the semiconductor film 1030 of the transistor 1101 may be formed using a single-layer metal oxide film.

To fabricate the transistor, the variety of films such as the conductive films, the semiconductor films, and the insulating films can be formed by a sputtering method or a plasma CVD method; however, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the inorganic insulating film which have been disclosed in the embodiments can be formed by a thermal CVD method such as a MOCVD method or an ALD method. For example, in the case where an In—Ga—Zn—O film is formed, trimethylindium, trimethylgallium, and dimethylzinc can be used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed using a deposition apparatus employing ALD, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be implemented in appropriate combination with other embodiments.

(Embodiment 8)

<Structure of Oxide Semiconductor>

A structure of an oxide semiconductor is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 10A:
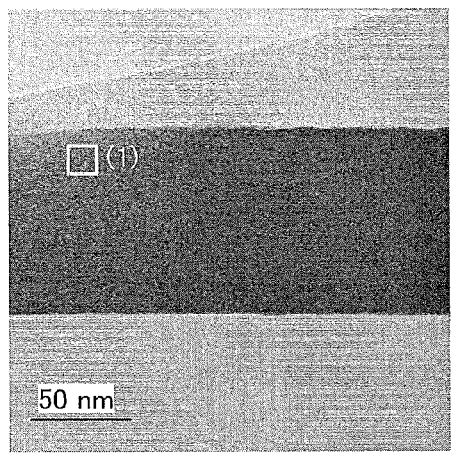
FIGS. 10A to 10D are Cs-corrected high-resolution TEM images of a cross section of a CAAC-OS and a cross-sectional schematic view of a CAAC-OS.

A CAAC-OS observed with TEM is described below. FIG. 10A shows a high-resolution TEM image of a cross section of the CAAC-OS, which is observed from a direction substantially parallel to the sample surface. The high-resolution IBM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 10B:
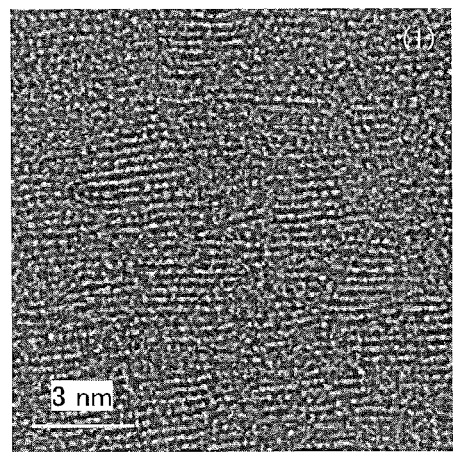

FIG. 10B is an enlarged Cs-corrected high-resolution TEM image of a region (1) in FIG. 10A. FIG. 10B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 10C:
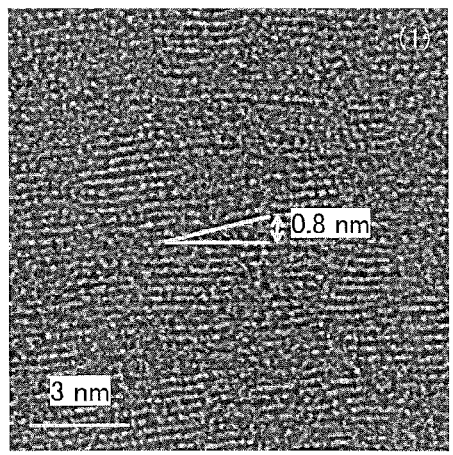

As shown in FIG. 10B, the CAAC-OS has a characteristic atomic arrangement. The characteristic atomic arrangement is denoted by an auxiliary line in FIG. 10C. FIGS. 10B and 10C prove that the size of a pellet is approximately 1 nm to 3 nm, and the size of a space caused by tilt of the pellets is approximately 0.8 nm Therefore, the pellet can also be referred to as a nanocrystal (nc). Furthermore, the CAAC-OS can also be referred to as an oxide semiconductor including c-axis aligned nanocrystals (CANC).

Figure 10D:
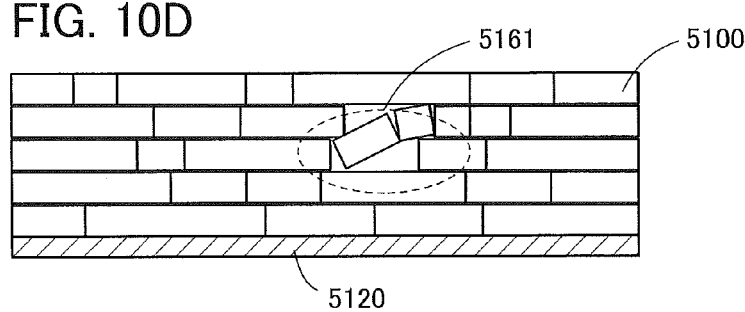

Here, according to the Cs-corrected high-resolution TEM images, the schematic arrangement of pellets 5100 of a CAAC-OS over a substrate 5120 is illustrated by such a structure in which bricks or blocks are stacked (see FIG. 10D). The part in which the pellets are tilted as observed in FIG. 10C corresponds to a region 5161 shown in FIG. 10D.

Figure 11A:
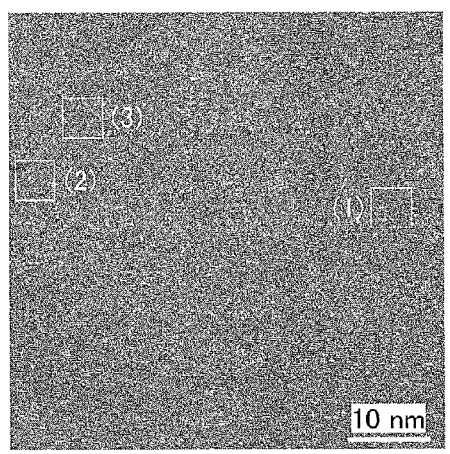
FIGS. 11A to 11D are Cs-corrected high-resolution TEM images of a plane of a CAAC-OS.
Figure 11B:
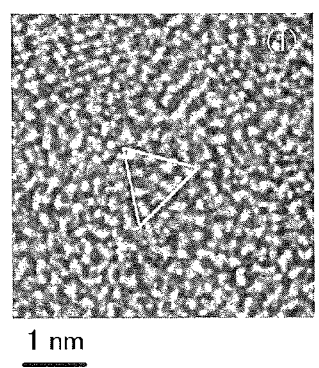
Figure 11C:
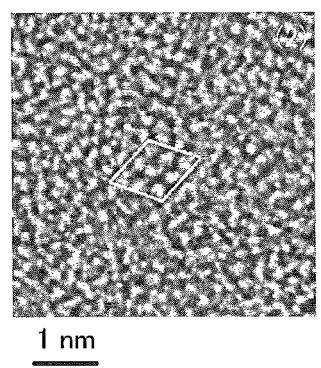
Figure 11D:
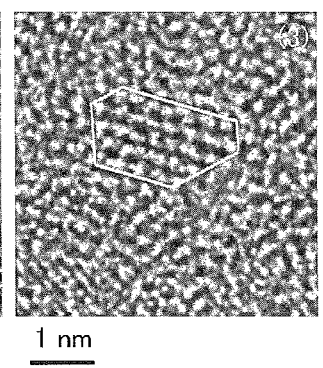

FIG. 11A shows a Cs-corrected high-resolution TEM image of a plane of the CAAC-OS observed from a direction substantially perpendicular to the sample surface. FIGS. 11B, 11C, and 11D are enlarged Cs-corrected high-resolution TEM images of regions (1), (2), and (3) in FIG. 11A, respectively. FIGS. 11B, 11C, and 11D indicate that metal atoms are arranged in a triangular, quadrangular, or hexagonal configuration in a pellet. However, there is no regularity of arrangement of metal atoms between different pellets.

Figure 12A:
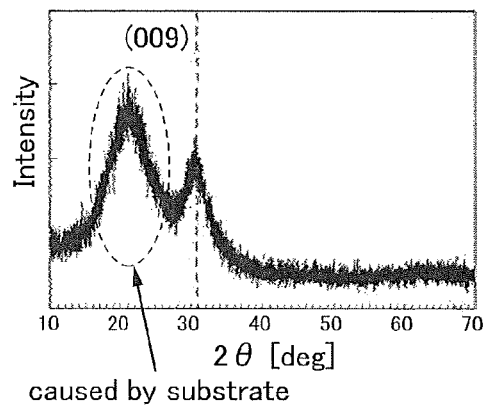
FIGS. 12A to 12C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 12A. This peak is assigned to the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 12B:
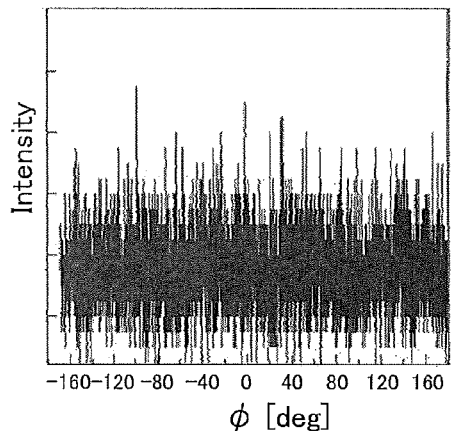
Figure 12C:
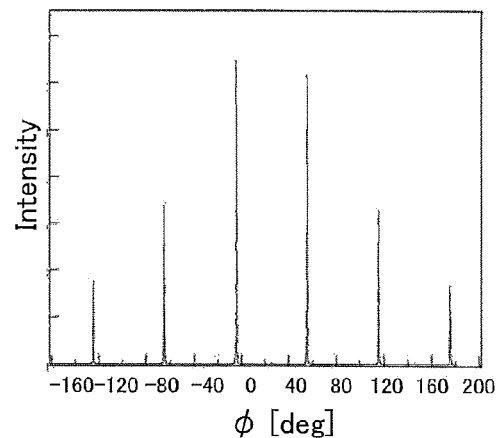

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 12B, a peak is not clearly observed. In contrast, in the case of a single crystal oxide semiconductor of $InGaZnO_4$, when φ scan is performed with 2θ fixed at around 56°, as shown in FIG. 12C, six peaks which are assigned to crystal planes equivalent to the (110) plane are observed. Accordingly, the structural analysis using XRD shows that the directions of a-axes and b-axes are irregularly oriented in the CAAC-OS.

Figure 13A:
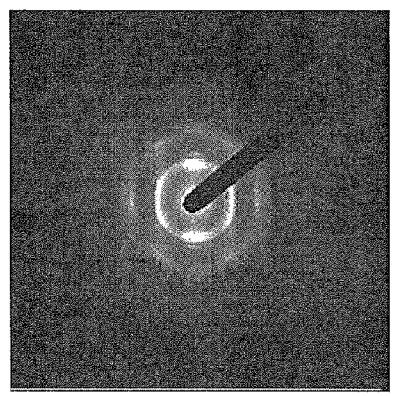
FIGS. 13A and 13B show electron diffraction patterns of a CAAC-OS.
Figure 13B:
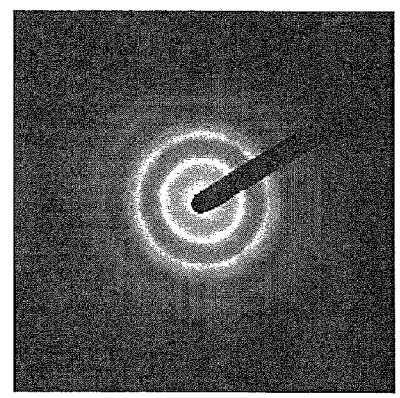

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 13A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 13B shows a diffraction pattern obtained in such a manner that an electron beam with a probe diameter of 300 nm is incident on the same sample in a direction perpendicular to the sample surface. As shown in FIG. 13B, a ring-like diffraction pattern is observed. Thus, the electron diffraction also indicates that the a-axes and b-axes of the pellets included in the CAAC-OS do not have regular alignment. The first ring in FIG. 13B is considered to be derived from the (010) plane, the (100) plane, and the like of the $InGaZnO_4$ crystal. The second ring in FIG. 13B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 14:
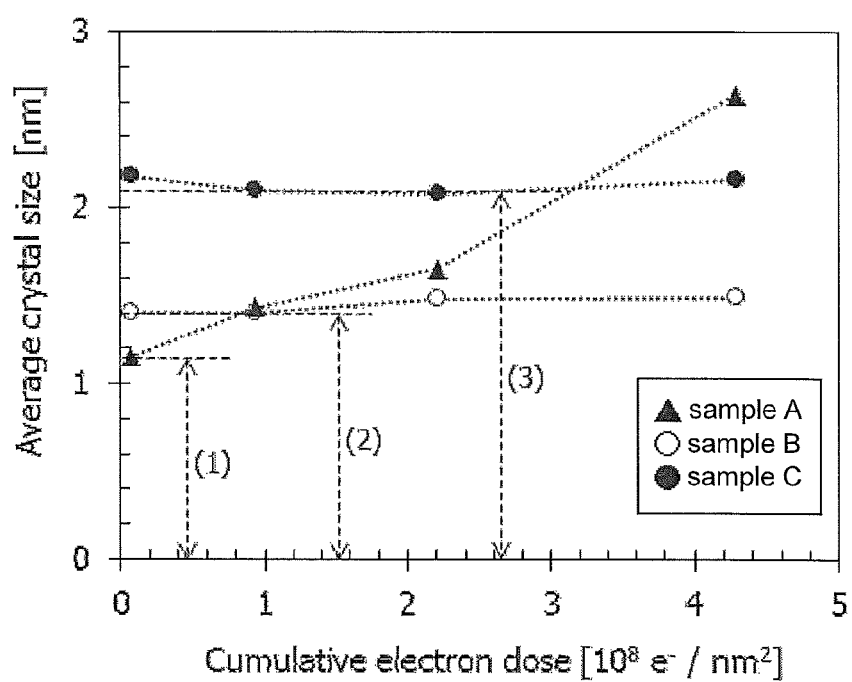
FIG. 14 shows a change in crystal part of an In—Ga—Zn oxide induced by electron irradiation.

FIG. 14 shows change in the average size of crystal parts (at 22 points to 45 points) in each sample. Note that the crystal part size corresponds to the length of a lattice fringe. FIG. 14 indicates that the crystal part size in the a-like OS increases with an increase in the cumulative electron dose. Specifically, as shown by (1) in FIG. 14, a crystal part of approximately 1.2 mn (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 14, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Note that this embodiment can be implemented in appropriate combination with other embodiments.

(Embodiment 9)

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 15A to 15F illustrate specific examples of these electronic devices.

Figure 15A:
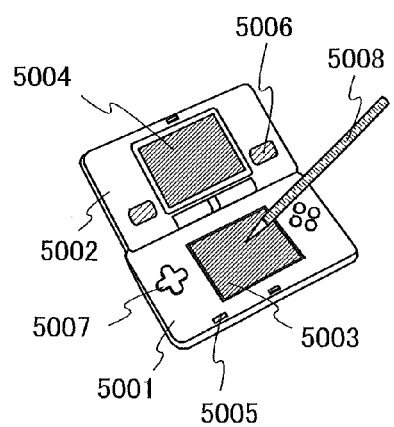
FIGS. 15A to 15F each illustrate an electronic device.

FIG. 15A illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Although the portable game machine in FIG. 15A has the two display portions 5003 and 5004, the number of display portions included in a portable game machine is not limited to this.

Figure 15B:
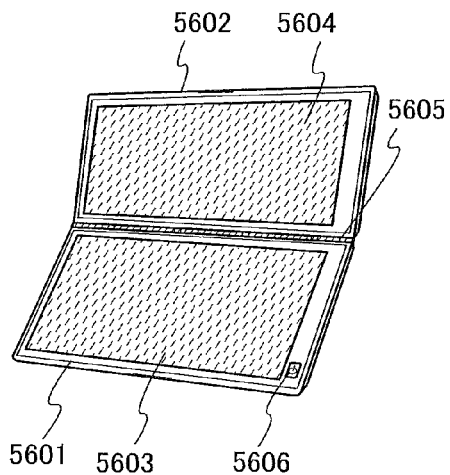

FIG. 15B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 15C:
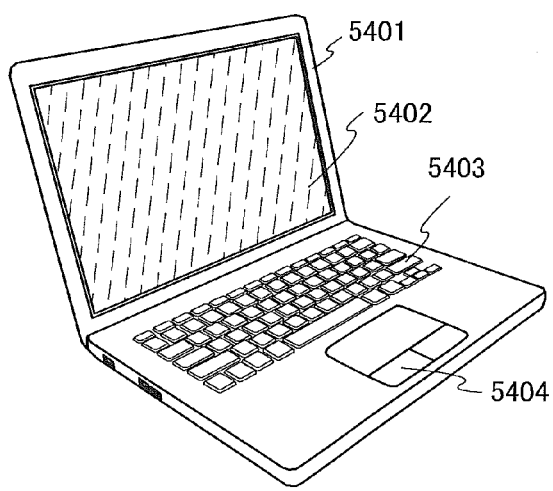

FIG. 15C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 15D:
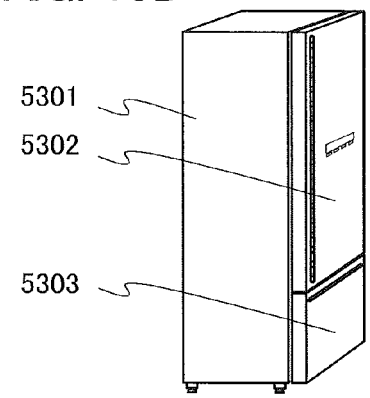

FIG. 15D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 15E:
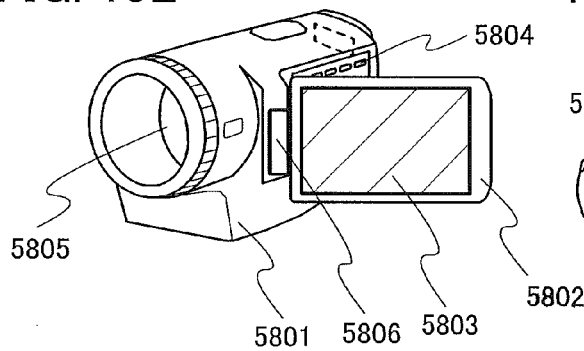

FIG. 15E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 15F:
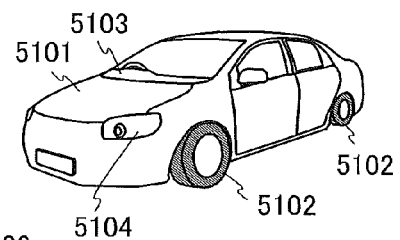

FIG. 15F illustrates a passenger car including a car body 5101, wheels 5102, a dashboard 5103, lights 5104, and the like. The semiconductor device of one embodiment of the present invention can be used for a variety of integrated circuits included in passenger cars.

For example, in this specification and the like, an explicit description "X and Y are connected" means that X and Y are electrically connected, X and Y are functionally connected, and X and Y are directly connected. Accordingly, without limiting to a predetermined connection relation, for example, a connection relation shown in drawings and texts, another element may be interposed between elements having the connection relation shown in the drawings and the texts.

Here, X and Y each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit expression "X and Y are electrically connected" is the same as the explicit simple expression "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X the source (or the first terminal or the like) of the transistor, the drain (or the second terminal or the like) of the transistor, and Y are provided to be connected in this order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, Z2 each denote an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including first to fifth transistors is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted. In this specification, the term "signal" used in the description of a circuit sometimes means a circuit and the term "circuit" sometimes means a signal.

Note that in this specification and the like, part of a diagram or text described in one embodiment can be taken out to constitute one embodiment of the invention. Thus, in the case where a diagram or text related to a certain portion is described, the, contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E," "A includes E and F," "A includes C, E, and F," or "A includes B, C, D, and E."

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-042758 filed with Japan Patent Office on Mar. 5, 2014 and Japanese Patent Application serial no. 2014-048642 filed with Japan Patent Office on Mar. 12, 2014, the entire contents of which are hereby incorporated by reference.

What is claimed is:

1. A level shifter circuit comprising:
a first transistor;
a second transistor;
a third transistor;
a fourth transistor;
a fifth transistor;
a sixth transistor;
a seventh transistor;
an eighth transistor;
a ninth transistor;
a tenth transistor;
a first capacitor;
a second capacitor;
a first potential power supply line;
a second potential power supply line;
a third potential power supply line;
an output signal line;
an inverted output signal line;
an input signal line; and
an inverted input signal line,
wherein one of a source and a drain of the first transistor is electrically connected to the first potential power supply line,
wherein the other of the source and the drain of the first transistor is electrically connected to the inverted output signal line,
wherein a gate of the first transistor is electrically connected to one of a source and a drain of the sixth transistor,
wherein one of a source and a drain of the second transistor is electrically connected to the first potential power supply line,
wherein the other of the source and the drain of the second transistor is electrically connected to the output signal line,
wherein a gate of the second transistor is electrically connected to one of a source and a drain of the fifth transistor,
wherein one of a source and a drain of the third transistor is electrically connected to the inverted output signal line,
wherein the other of the source and the drain of the third transistor is electrically connected to one of a source and a drain of the ninth transistor,
wherein a gate of the third transistor is electrically connected to the input signal line,
wherein one of a source and a drain of the fourth transistor is electrically connected to the output signal line,
wherein the other of the source and the drain of the fourth transistor is electrically connected to one of a source and a drain of the tenth transistor,
wherein a gate of the fourth transistor is electrically connected to the inverted input signal line,
wherein the other of the source and the drain of the fifth transistor is electrically connected to the second potential power supply line,
wherein a gate of the fifth transistor is electrically connected to the input signal line,
wherein the other of the source and the drain of the sixth transistor is electrically connected to the second potential power supply line,
wherein a gate of the sixth transistor is electrically connected to the inverted input signal line,
wherein one of a source and a drain of the seventh transistor is electrically connected to the input signal line,
wherein the other of the source and the drain of the seventh transistor is electrically connected to a gate of the ninth transistor,
wherein a gate of the seventh transistor is electrically connected to the third potential power supply line, wherein one of a source and a drain of the eighth transistor is electrically connected to the inverted input signal line, wherein the other of the source and the drain of the eighth transistor is electrically connected to a gate of the tenth transistor, wherein a gate of the eighth transistor is electrically connected to the third potential power supply line, wherein the other of the source and the drain of the ninth transistor is electrically connected to the second potential power supply line, wherein the other of the source and the drain of the tenth transistor is electrically connected to the second potential power supply line, wherein a first electrode of the first capacitor is electrically connected to the output signal line, wherein a second electrode of the first capacitor is electrically connected to the gate of the ninth transistor, wherein a first electrode of the second capacitor is electrically connected to the inverted output signal line, and wherein a second electrode of the second capacitor is electrically connected to the gate of the tenth transistor.

2. The level shifter circuit according to claim 1, wherein the first transistor and the second transistor are p-channel silicon transistors, wherein the third transistor, the fourth transistor, the fifth transistor, and the sixth transistor are n-channel silicon transistors, and wherein the seventh transistor, the eighth transistor, the ninth transistor, and the tenth transistor are oxide semiconductor transistors.

3. The level shifter circuit according to claim 1, further comprising:

an eleventh transistor; and a twelfth transistor, wherein the gate of the first transistor is electrically connected to a gate of the twelfth transistor, wherein the gate of the second transistor is electrically connected to a gate of the eleventh transistor, wherein one of a source and a drain of the eleventh transistor is electrically connected to the inverted output signal line, wherein the other of the source and the drain of the eleventh transistor is electrically connected to the gate of the eleventh transistor, wherein one of a source and a drain of the twelfth transistor is electrically connected to the output signal line, and wherein the other of the source and the drain of the twelfth transistor is electrically connected to the gate of the twelfth transistor.

4. The level shifter circuit according to claim 3, wherein the first transistor, the second transistor, the eleventh transistor, and the twelfth transistor are p-channel silicon transistors, wherein the third transistor, the fourth transistor, the fifth transistor, and the sixth transistor are n-channel silicon transistors, and wherein the seventh transistor, the eighth transistor, the ninth transistor, and the tenth transistor are oxide semiconductor transistors.

5. The level shifter circuit according to claim 1, further comprising:

a thirteenth transistor; and a fourteenth transistor, wherein one of a source and a drain of the thirteenth transistor is electrically connected to the gate of the first transistor, wherein the other of the source and the drain of the thirteenth transistor is electrically connected to the output signal line, wherein a gate of the thirteenth transistor is electrically connected to the first potential power supply line, wherein one of a source and a drain of the fourteenth transistor is electrically connected to the gate of the second transistor, wherein the other of the source and the drain of the fourteenth transistor is electrically connected to the inverted output signal line, and wherein a gate of the fourteenth transistor is electrically connected to the first potential power supply line.

6. The level shifter circuit according to claim 5, wherein the first transistor and the second transistor are p-channel silicon transistors, wherein the third transistor, the fourth transistor, the fifth transistor, the sixth transistor, the thirteenth transistor, and the fourteenth transistor are n-channel silicon transistors, and wherein the seventh transistor, the eighth transistor, the ninth transistor, and the tenth transistor are oxide semiconductor transistors.

7. The level shifter circuit according to claim 1, further comprising:

a first resistor; and a second resistor, wherein a first terminal of the first resistor is electrically connected to the gate of the first transistor, wherein a second terminal of the first resistor is electrically connected to the output signal line, wherein a first terminal of the second resistor is electrically connected to the gate of the second transistor, and wherein a second terminal of the second resistor is electrically connected to the inverted output signal line.

8. The level shifter circuit according to claim 1, further comprising:

a fifteenth transistor;

a sixteenth transistor;

a seventeenth transistor;

an eighteenth transistor;

a nineteenth transistor; and a twentieth transistor, wherein a gate of the fifteenth transistor is electrically connected to the first potential power supply line, wherein a gate of the sixteenth transistor is electrically connected to the first potential power supply line, wherein the gate of the first transistor is electrically connected to one of a source and a drain of the fifteenth transistor, wherein the gate of the second transistor is electrically connected to one of a source and a drain of the sixteenth transistor, wherein one of a source and a drain of the seventeenth transistor is electrically connected to the inverted output signal line, wherein the other of the source and the drain of the seventeenth transistor is electrically connected to a gate of the seventeenth transistor, wherein the gate of the seventeenth transistor is electrically connected to the other of the source and the drain of the sixteenth transistor, wherein one of a source and a drain of the eighteenth transistor is electrically connected to the output signal line,
wherein the other of the source and the drain of the eighteenth transistor is electrically connected to a gate of the eighteenth transistor,
wherein the gate of the eighteenth transistor is electrically connected to the other of the source and the drain of the fifteenth transistor,
wherein one of a source and a drain of the nineteenth transistor is electrically connected to the other of the source and the drain of the seventeenth transistor,
wherein the other of the source and the drain of the nineteenth transistor is electrically connected to the second potential power supply line,
wherein a gate of the nineteenth transistor is electrically connected to the input signal line,
wherein one of a source and a drain of the twentieth transistor is electrically connected to the other of the source and the drain of the eighteenth transistor,
wherein the other of the source and the drain of the twentieth transistor is electrically connected to the second potential power supply line, and
wherein a gate of the twentieth transistor is electrically connected to the inverted input signal line.

9. The level shifter circuit according to claim 8,
wherein the first transistor, the second transistor, the seventeenth transistor, and the eighteenth transistor are p-channel silicon transistors,
wherein the third transistor, the fourth transistor, the fifth transistor, the sixth transistor, the fifteenth transistor, the sixteenth transistor, the nineteenth transistor, and the twentieth transistor are n-channel silicon transistors, and
wherein the seventh transistor, the eighth transistor, the ninth transistor, and the tenth transistor are oxide semiconductor transistors.

10. A level shifter circuit comprising:
a first transistor;
a second transistor;
a third transistor;
a fourth transistor;
a fifth transistor;
a sixth transistor;
a seventh transistor;
an eighth transistor;
a ninth transistor;
a tenth transistor;
a first potential power supply line;
a second potential power supply line;
a third potential power supply line;
an output signal line;
an inverted output signal line;
an input signal line; and
an inverted input signal line,
wherein one of a source and a drain of the first transistor is electrically connected to the first potential power supply line,
wherein the other of the source and the drain of the first transistor is electrically connected to the inverted output signal line,
wherein a gate of the first transistor is electrically connected to one of a source and a drain of the sixth transistor,
wherein one of a source and a drain of the second transistor is electrically connected to the first potential power supply line,
wherein the other of the source and the drain of the second transistor is electrically connected to the output signal line,
wherein a gate of the second transistor is electrically connected to one of a source and a drain of the fifth transistor,
wherein one of a source and a drain of the third transistor is electrically connected to the inverted output signal line,
wherein the other of the source and the drain of the third transistor is electrically connected to one of a source and a drain of the ninth transistor,
wherein a gate of the third transistor is electrically connected to the input signal line,
wherein one of a source and a drain of the fourth transistor is electrically connected to the output signal line,
wherein the other of the source and the drain of the fourth transistor is electrically connected to one of a source and a drain of the tenth transistor,
wherein a gate of the fourth transistor is electrically connected to the inverted input signal line,
wherein the other of the source and the drain of the fifth transistor is electrically connected to the second potential power supply line,
wherein a gate of the fifth transistor is electrically connected to the input signal line,
wherein the other of the source and the drain of the sixth transistor is electrically connected to the second potential power supply line,
wherein a gate of the sixth transistor is electrically connected to the inverted input signal line,
wherein one of a source and a drain of the seventh transistor is electrically connected to the input signal line,
wherein the other of the source and the drain of the seventh transistor is electrically connected to a gate of the ninth transistor,
wherein a gate of the seventh transistor is electrically connected to the third potential power supply line,
wherein one of a source and a drain of the eighth transistor is electrically connected to the inverted input signal line,
wherein the other of the source and the drain of the eighth transistor is electrically connected to a gate of the tenth transistor,
wherein a gate of the eighth transistor is electrically connected to the third potential power supply line,
wherein the other of the source and the drain of the ninth transistor is electrically connected to the second potential power supply line, and
wherein the other of the source and the drain of the tenth transistor is electrically connected to the second potential power supply line.

11. The level shifter circuit according to claim 10,
wherein the first transistor and the second transistor are p-channel silicon transistors,
wherein the third transistor, the fourth transistor, the fifth transistor, and the sixth transistor are n-channel silicon transistors, and
wherein the seventh transistor, the eighth transistor, the ninth transistor, and the tenth transistor are oxide semiconductor transistors.

12. The level shifter circuit according to claim 10, further comprising:
an eleventh transistor; and
a twelfth transistor, wherein the gate of the first transistor is electrically connected to a gate of the twelfth transistor, wherein the gate of the second transistor is electrically connected to a gate of the eleventh transistor, wherein one of a source and a drain of the eleventh transistor is electrically connected to the inverted output signal line, wherein the other of the source and the drain of the eleventh transistor is electrically connected to the gate of the eleventh transistor, wherein one of a source and a drain of the twelfth transistor is electrically connected to the output signal line, and wherein the other of the source and the drain of the twelfth transistor is electrically connected to the gate of the twelfth transistor.

13. The level shifter circuit according to claim 12, wherein the first transistor, the second transistor, the eleventh transistor, and the twelfth transistor are p-channel silicon transistors, wherein the third transistor, the fourth transistor, the fifth transistor, and the sixth transistor are n-channel silicon transistors, and wherein the seventh transistor, the eighth transistor, the ninth transistor, and the tenth transistor are oxide semiconductor transistors.

14. The level shifter circuit according to claim 10, further comprising:

a thirteenth transistor; and a fourteenth transistor, wherein one of a source and a drain of the thirteenth transistor is electrically connected to the gate of the first transistor, wherein the other of the source and the drain of the thirteenth transistor is electrically connected to the output signal line, wherein a gate of the thirteenth transistor is electrically connected to the first potential power supply line, wherein one of a source and a drain of the fourteenth transistor is electrically connected to the gate of the second transistor, wherein the other of the source and the drain of the fourteenth transistor is electrically connected to the inverted output signal line, and wherein a gate of the fourteenth transistor is electrically connected to the first potential power supply line.

15. The level shifter circuit according to claim 14, wherein the first transistor and the second transistor are p-channel silicon transistors, wherein the third transistor, the fourth transistor, the fifth transistor, the sixth transistor, the thirteenth transistor, and the fourteenth transistor are n-channel silicon transistors, and wherein the seventh transistor, the eighth transistor, the ninth transistor, and the tenth transistor are oxide semiconductor transistors.

16. The level shifter circuit according to claim 10, further comprising:

a first resistor; and a second resistor, wherein a first terminal of the first resistor is electrically connected to the gate of the first transistor, wherein a second terminal of the first resistor is electrically connected to the output signal line, wherein a first terminal of the second resistor is electrically connected to the gate of the second transistor, and wherein a second terminal of the second resistor is electrically connected to the inverted output signal line.

17. The level shifter circuit according to claim 10, further comprising:

a fifteenth transistor;

a sixteenth transistor;

a seventeenth transistor;

an eighteenth transistor;

a nineteenth transistor; and a twentieth transistor, wherein a gate of the fifteenth transistor is electrically connected to the first potential power supply line, wherein a gate of the sixteenth transistor is electrically connected to the first potential power supply line, wherein the gate of the first transistor is electrically connected to one of a source and a drain of the fifteenth transistor, wherein the gate of the second transistor is electrically connected to one of a source and a drain of the sixteenth transistor, wherein one of a source and a drain of the seventeenth transistor is electrically connected to the inverted output signal line, wherein the other of the source and the drain of the seventeenth transistor is electrically connected to a gate of the seventeenth transistor, wherein the gate of the seventeenth transistor is electrically connected to the other of the source and the drain of the sixteenth transistor, wherein one of a source and a drain of the eighteenth transistor is electrically connected to the output signal line, wherein the other of the source and the drain of the eighteenth transistor is electrically connected to a gate of the eighteenth transistor, wherein the gate of the eighteenth transistor is electrically connected to the other of the source and the drain of the fifteenth transistor, wherein one of a source and a drain of the nineteenth transistor is electrically connected to the other of the source and the drain of the seventeenth transistor, wherein the other of the source and the drain of the nineteenth transistor is electrically connected to the second potential power supply line, wherein a gate of the nineteenth transistor is electrically connected to the input signal line, wherein one of a source and a drain of the twentieth transistor is electrically connected to the other of the source and the drain of the eighteenth transistor, wherein the other of the source and the drain of the twentieth transistor is electrically connected to the second potential power supply line, and wherein a gate of the twentieth transistor is electrically connected to the inverted input signal line.

18. The level shifter circuit according to claim 17, wherein the first transistor, the second transistor, the seventeenth transistor, and the eighteenth transistor are p-channel silicon transistors, wherein the third transistor, the fourth transistor, the fifth transistor, the sixth transistor, the fifteenth transistor, the sixteenth transistor, the nineteenth transistor, and the twentieth transistor are n-channel silicon transistors, and wherein the seventh transistor, the eighth transistor, the ninth transistor, and the tenth transistor are oxide semiconductor transistors.

19. A level shifter circuit comprising:
a first transistor;
a second transistor;
a third transistor;
a fourth transistor;
a fifth transistor;
a sixth transistor;
a first capacitor;
a second capacitor;
a potential power supply line;
a first output signal line;
a second output signal line;
a first input signal line; and
a second input signal line,
wherein one of a source and a drain of the first transistor is electrically connected to the first input signal line,
wherein the other of the source and the drain of the first transistor is electrically connected to a gate of the second transistor,
wherein a first electrode of the first capacitor is electrically connected to the gate of the second transistor,
wherein a second electrode of the first capacitor is electrically connected to the first output signal line,
wherein one of a source and a drain of the second transistor is electrically connected to the potential power supply line,
wherein the other of the source and the drain of the second transistor is electrically connected to one of a source and a drain of the third transistor,
wherein the other of the source and the drain of the third transistor is electrically connected to the second output signal line,
wherein one of a source and a drain of the fourth transistor is electrically connected to the second input signal line,
wherein the other of the source and the drain of the fourth transistor is electrically connected to a gate of the fifth transistor,
wherein a first electrode of the second capacitor is electrically connected to the gate of the fifth transistor,
wherein a second electrode of the second capacitor is electrically connected to the second output signal line,
wherein one of a source and a drain of the fifth transistor is electrically connected to the potential power supply line,
wherein the other of the source and the drain of the fifth transistor is electrically connected to one of a source and a drain of the sixth transistor, and
wherein the other of the source and the drain of the sixth transistor is electrically connected to the first output signal line.

20. The level shifter circuit according to claim 19,
wherein the third transistor and the sixth transistor are n-channel silicon transistors, and
wherein the first transistor, the second transistor, the fourth transistor, and the fifth transistor are oxide semiconductor transistors.

* * * * *